US012641876B2

(12) United States Patent
Senapati et al.

(10) Patent No.: US 12,641,876 B2
(45) Date of Patent: May 26, 2026

(54) STACKED NANOSHEET FETS WITH GATE DIELECTRIC FILL

(71) Applicant: INTERNATIONAL BUSINESS MACHINES CORPORATION, Armonk, NY (US)

(72) Inventors: Biswanath Senapati, Mechanicville, NY (US); Shahrukh Khan, Sandy Hook, CT (US); Utkarsh Bajpai, Delmar, NY (US); Terence Hook, Jericho Center, VT (US); Chen Zhang, Santa Clara, CA (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 421 days.

(21) Appl. No.: 18/214,682

(22) Filed: Jun. 27, 2023

(65) Prior Publication Data

US 2025/0006736 A1      Jan. 2, 2025

(51) Int. Cl.
H10D 84/85        (2025.01)
H10D 30/01        (2025.01)
(Continued)

(52) U.S. Cl.
CPC ......... H10D 84/856 (2025.01); H10D 30/014 (2025.01); H10D 30/43 (2025.01);
(Continued)

(58) Field of Classification Search
CPC .... H10D 84/856; H10D 30/014; H10D 30/43; H10D 30/6735; H10D 62/121; H10D 64/017; H10D 84/0167; H10D 84/0179;

H10D 84/0188; H10D 84/038; H10D 88/01; H10D 84/0128; H10D 84/83; H10D 88/00; H10D 84/0142; H10D 84/0151
See application file for complete search history.

(56)        References Cited

U.S. PATENT DOCUMENTS 8,841,711 B1     9/2014  Cai et al.
9,224,811 B2    12/2015  Cheng
(Continued)

FOREIGN PATENT DOCUMENTS

EP        2519975 B1    5/2018
EP        4089722 A1   11/2022

OTHER PUBLICATIONS

Acord, J. et al., "Comprehensive and Accurate Parasitic Capacitance Models for Two- and Three-Dimensional CMOS Device Structures," in IEEE Transactions on Electron Devices, vol. 59, No. 5, pp. 1332-1344, May 2012, doi: 10.1109/TED.2012.2187454.
(Continued)

*Primary Examiner* — Christine S. Kim
*Assistant Examiner* — Nathalie R Fayette
(74) *Attorney, Agent, or Firm* — Samuel A. Waldbaum

(57)        ABSTRACT

A semiconductor cell comprises a top FET that contains a first set of silicon nanosheets and a bottom FET that contains a second set of silicon nanosheets. The top FET and bottom FET are in a stacked profile. The semiconductor cell comprises a top FET cutout region lateral to the first set of nanosheets and above a portion of the second set of nanosheets. The semiconductor cell also comprises a dielectric fill within the top FET cutout region.

19 Claims, 17 Drawing Sheets

200

(51) Int. Cl.

| | |
|---|---|
| *H10D 30/43* | (2025.01) |
| *H10D 30/67* | (2025.01) |
| *H10D 62/10* | (2025.01) |
| *H10D 64/01* | (2025.01) |
| *H10D 84/01* | (2026.01) |
| *H10D 84/03* | (2025.01) |
| *H10D 88/00* | (2026.01) |

(52) U.S. Cl.
CPC ....... *H10D 30/6735* (2025.01); *H10D 62/121* (2025.01); *H10D 64/017* (2025.01); *H10D 84/0167* (2025.01); *H10D 84/0179* (2025.01); *H10D 84/0188* (2025.01); *H10D 84/038* (2025.01); *H10D 88/01* (2025.01)

(56) References Cited

U.S. PATENT DOCUMENTS

| | | | |
|---|---|---|---|
| 9,659,963 | B2 | 5/2017 | Cheng |
| 9,698,245 | B2 | 7/2017 | Cheng et al. |
| 9,837,414 | B1 | 12/2017 | Balakrishnan |
| 9,997,598 | B2 | 6/2018 | Smith |
| 10,026,824 | B1 | 7/2018 | Chanemougame et al. |
| 10,164,104 | B2 | 12/2018 | Zhang et al. |
| 10,192,819 | B1 | 1/2019 | Chanemougame et al. |
| 10,192,867 | B1 | 1/2019 | Frougier |
| 10,283,621 | B2 | 5/2019 | Ruilong |
| 10,461,186 | B1 | 10/2019 | Zhang |
| 10,658,462 | B2 | 5/2020 | Lee |
| 10,679,894 | B2 | 6/2020 | Frougier et al. |
| 10,714,391 | B2 | 7/2020 | Smith |
| 10,748,994 | B2 | 8/2020 | Reznicek |
| 10,811,415 | B2 | 10/2020 | Sengupta |
| 10,833,078 | B2 * | 11/2020 | Smith ................... H10D 30/43 |
| 10,879,352 | B2 | 12/2020 | Zhang |
| 11,069,684 | B1 | 7/2021 | Xie et al. |
| 11,121,044 | B2 | 9/2021 | Cheng |
| 11,121,236 | B2 | 9/2021 | Wu et al. |
| 11,158,544 | B2 | 10/2021 | Cheng |
| 11,164,793 | B2 | 11/2021 | Xie et al. |
| 11,239,232 | B2 | 2/2022 | Lilak |
| 11,367,722 | B2 | 6/2022 | Lilak |
| 11,502,167 | B2 | 11/2022 | Hong |
| 12,040,400 | B2 | 7/2024 | Chiang et al. |
| 12,356,665 | B2 * | 7/2025 | Yun ........................ H10D 84/83 |
| 2020/0020587 | A1 | 1/2020 | Cheng et al. |
| 2020/0203343 | A1 | 6/2020 | Zhu et al. |
| 2021/0028169 | A1 | 1/2021 | Smith et al. |
| 2021/0098464 | A1 | 4/2021 | Huang |
| 2021/0296184 | A1 | 9/2021 | Xie et al. |
| 2021/0305246 | A1 | 9/2021 | Huang et al. |
| 2021/0313231 | A1 | 10/2021 | Thompson |
| 2021/0407999 | A1 | 12/2021 | Huang |
| 2022/0301936 | A1 | 9/2022 | Merchant |
| 2022/0352181 | A1 | 11/2022 | Yang |
| 2022/0367520 | A1 | 11/2022 | Hong et al. |
| 2022/0367658 | A1 | 11/2022 | Yim |
| 2023/0051674 | A1 | 2/2023 | Wu et al. |
| 2023/0086084 | A1 | 3/2023 | Yun et al. |
| 2023/0125316 | A1 | 4/2023 | Xie et al. |
| 2023/0178554 | A1 | 6/2023 | Chehab et al. |
| 2023/0178593 | A1 | 6/2023 | Yeh et al. |
| 2023/0268388 | A1 | 8/2023 | Xie et al. |
| 2023/0307456 | A1 | 9/2023 | Lin et al. |
| 2023/0343823 | A1 | 10/2023 | Baek et al. |
| 2023/0402519 | A1 | 12/2023 | Anderson et al. |
| 2024/0006244 | A1 | 1/2024 | Mochizuki et al. |
| 2025/0048690 | A1 | 2/2025 | Chehab et al. |
| 2025/0133816 | A1 | 4/2025 | Xie et al. |
| 2025/0203963 | A1 | 6/2025 | Bao et al. |
| 2025/0204041 | A1 | 6/2025 | Bao et al. |
| 2025/0239521 | A1 | 7/2025 | Reboh et al. |

OTHER PUBLICATIONS

List of IBM Patents or Patent Applications to be Treated as Related, Dated Jun. 26, 2023, 2 pgs.

Song, T, "Many-Tier Vertical GAAFET (V-FET) for Ultra-Miniaturized Standard Cell Designs Beyond 5 nm," in IEEE Access, vol. 8, pp. 149984-149998, 2020, doi: 10.1109/ACCESS.2020. 3015596.

Xie et al., "Stacked Fet With Low Parasitic-Capacitance Gate," U.S. Appl. No. 18/214,642, filed Jun. 27, 2023.

Xie et al., "Stacked Field-Effect Transistors," U.S. Appl. No. 17/651,919, filed Feb. 22, 2022.

International Searching Authority, "Invitation to Pay Additional Fees and Partial Search Report" Patent Cooperation Treaty, dated Aug. 12, 2024, 10 pages, International Application No.—PCT/ EP2024/064351.

International Searching Authority, "Notification of Transmittal of the International Search Report and the Written Opinion of the International Searching Authority, or Declaration," Patent Cooperation Treaty, Oct. 4, 2024, 20 pages, International Application No. PCT/ EP2024/064351.

International Searching Authority, Notification of Transmittal of the International Search Report and the Written Opinion of the International Searching Authority, or the Declaration, dated May 12, 2023, 12 pages, International Application No. PCT/IB2023/051261.

United States Ex Parte Quayle Action dated Aug. 25, 2025, 13 pages, in U.S. Appl. No. 17/651,919.

United States Requirement for Restriction/Election dated Mar. 20, 2025, 8 pages, in U.S. Appl. No. 17/651,919.

* cited by examiner

200

216

204D
204C
204B
204A
206
202B
202A

218

208D

200

216

200

222

220

200

222

220

216

200

208D
208C
224

200

208D
208C
224

200

200

230A 230B

200

200

230A     230B 204D
204C
204B
204A
206
202B
202A

232

208G
208F
208E
208D
208C
208B
208A

200

204D

200

242

204D

206

240

236

238

234

200

248    218    248

246

244

200

200

248

218    248

246

206

200

200

218

250 246

200

200

252

218

256

250    246

254

200

252

256

254

STACKED NANOSHEET FETS WITH GATE DIELECTRIC FILL

BACKGROUND

The present invention relates to nanosheet field effect transistors, and more specifically, to stacked nanosheet field effect transistors.

Nanosheet field effect transistors are a type of field effect transistor (FET) in which a set of parallel semiconductor sheets (referred to herein as "nanosheets") are patterned such that they are layered over each other. The set of nanosheets is typically surrounded on each side by gate material (sometimes referred to as "work function metal") that can be used to switch the state of the FET. Each nanosheet in the set is typically also separated from each other nanosheet by gate material. As a result, each nanosheet in a typical nanosheet FET has high contact area to the FET gate, causing the performance of the FET to be higher than previous FET designs (e.g., planar FETs).

In a stacked nanosheet cell design, two complementary nanosheet FETs are patterned over each other in the same dimension in which the nanosheets within each FET are patterned over each other. These two FETs are typically referred to as a "top FET" and a "bottom FET" based on their positions relative to the silicon substrate on which the nanosheet cell is formed. Specifically, the FET that is closer to the silicon substrate is typically referred to as the "bottom FET," and the FET that is farther from the silicon substrate is typically referred to as the "top FET."

Stacked nanosheet cell designs permit increased cell density, and corresponding performance increases, even beyond the advances resulting from the standard nanosheet FET design. However, each FET in the stacked cell typically requires a contact spanning from the top of the cell (i.e., opposite of the silicon substrate) to the diffusion regions (i.e., source or drain). Thus, in the typical stacked nanosheet cell design, the contact for the bottom FET diffusion regions passes through the top FET. This often requires that the nanosheet cell is formed in a stepped profile, in which the nanosheets of the top FET are not as wide as the nanosheets in the bottom FET. This provides an area through which the contact for the bottom-FET diffusion regions can travel. This area is often referred to herein as the top FET cutout region.

However, in the typical stacked FET design, the space to the left and right of the set of nanosheets is filled by gate material. Because the nanosheets in the top FET of a nanosheet cell are narrower than the nanosheets in the bottom FET of the nanosheet cell, the top FET of the cell is typically surrounded by more gate material than the bottom FET. In other words, the top FET cutout region is filled only with gate material, whereas the corresponding area of the bottom FET contains semiconductor nanosheets and diffusion regions.

Further, because the gate is composed of work function metal, the gate surrounding the FETs has a high capacitance. Thus, filling the top FET cutout region in the top FET with a large mass of gate material can cause a significant amount of parasitic capacitance at the top FET, reducing the switching speed of the top FET. Further, the excess gate material in the top FET cutout region can create capacitance between the top FET gate and the contact for the bottom FET diffusion regions, reducing the switching speed of the bottom FET as well. In some use cases, this parasitic capacitance can be significant enough to not only affect the performance of the FETs in the cell, but also the FETs of adjacent stacks.

SUMMARY

Some embodiments of the present disclosure can be illustrated as a semiconductor cell. The semiconductor cell comprises a top field effect transistor (FET) that contains a first set of silicon nanosheets. The semiconductor cell also comprises a bottom FET that contains a second set of silicon nanosheets. The top FET and bottom FET are in a stacked profile. The semiconductor cell also comprises a top FET cutout region that is lateral to the first set of nanosheets and above a portion of the second set of nanosheets. The semiconductor cell also comprises a dielectric fill within the top FET cutout region.

Some embodiments of the present disclosure can also be illustrated as a semiconductor cell in a set of semiconductor cells. The semiconductor cell comprises a top field effect transistor (FET) that contains a first set of silicon nanosheets. The semiconductor cell also comprises a bottom FET that contains a second set of silicon nanosheets. The top FET and bottom FET are in a stacked profile. The semiconductor cell also comprises a top FET cutout region that is lateral to the first set of nanosheets and above a portion of the second set of nanosheets. The semiconductor cell also comprises a dielectric fill within the top FET cutout region.

Some embodiments of the present disclosure can also be illustrated as a set of semiconductor cells. The set of semiconductor cells comprises a first semiconductor cell with a first top FET cutout region. A first dielectric fill is formed within the first top FET cutout region. The set of semiconductor cells also comprises a second semiconductor cell with a second top FET cutout region. A second dielectric fill is formed within the second top FET cutout region.

DETAILED DESCRIPTION

Figures 1A, 1B:
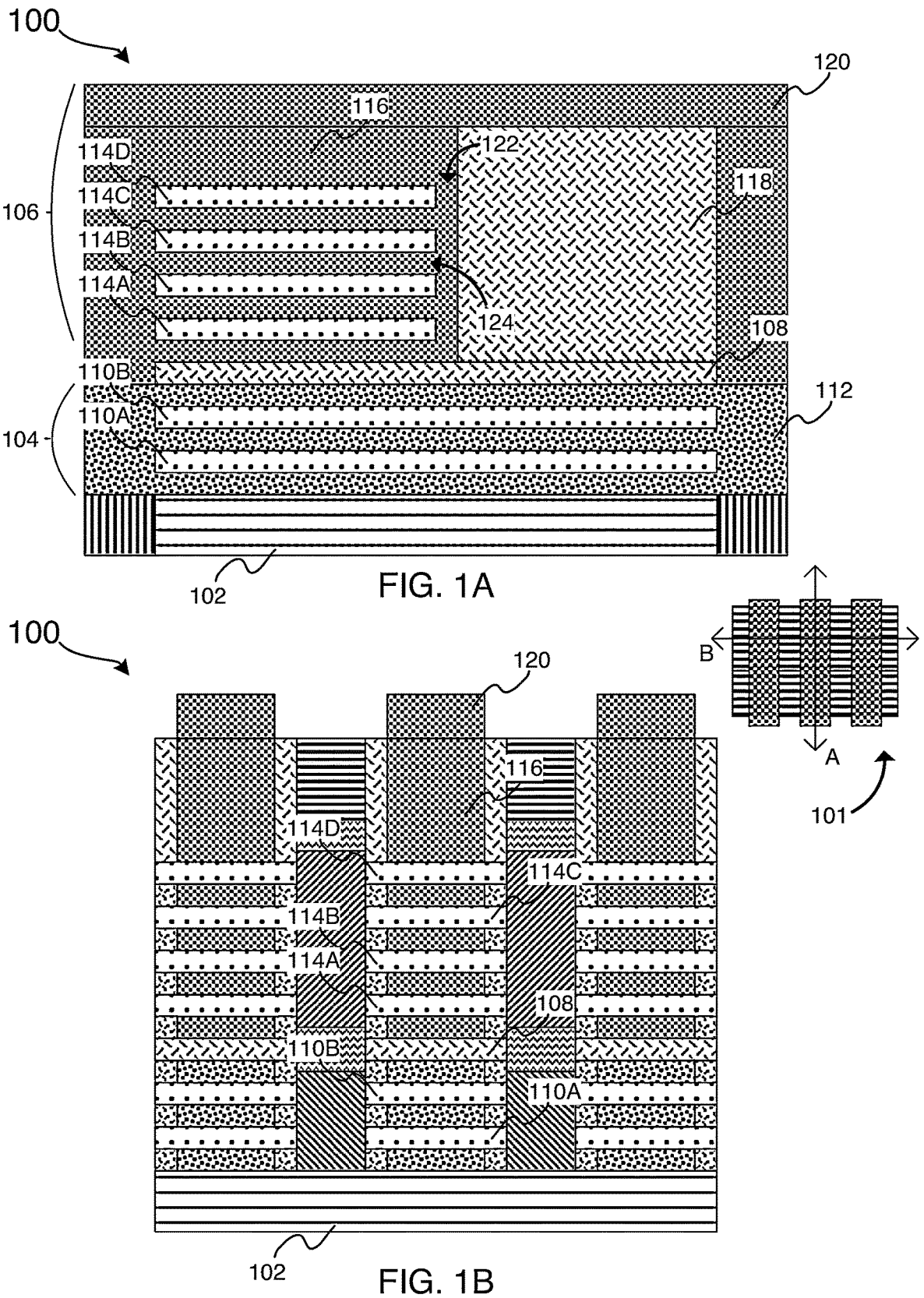
FIGS. 1A and 1B depict a cell in a stacked FET design in which the gate material from a top FET cutout region has been replaced by dielectric material, in accordance with embodiments of the present disclosure.

As noted, typical stacked nanosheet cell designs contain a top FET cutout region to the side of the nanosheets of the top FET and above a portion of the nanosheets of the bottom FET. This top FET cutout region provides an area through which contacts can travel to/from the diffusion regions of the bottom FET to the wiring at the top of the cell. Further, in typical stacked nanosheet cell designs, this top FET cutout region is filled with the work function metal for the top gate, causing capacitance problems for the top FET and sometimes the FETs of nearby cells.

Some embodiments of the present disclosure address these and other issues by replacing a significant amount of work function metal in the top FET cutout region with a dielectric material. For example, some embodiments of the present disclosure apply an etch mask to the top surface of the top FET's gate material after it has been formed around the top FET nanosheets. The etch mask could be applied to, for example, the gate material above the nanosheets of the top FET and above any components that are not part of the nanosheet cell. The hard mask could thus be used to etch a precise gate cut of the work function metal within the top FET cutout region. The void formed within the top FET cutout region could then be filled with a dielectric material. In some embodiments, this dielectric material may be selected based on exhibiting a particularly low dielectric constant, minimizing the capacitance penalty of the top FET cutout region. In some embodiments, the hard mask can be removed and a gate cap can then be placed upon the previously existing gate material and the dielectric material. This gate cap may be of the same work function metal as the work function metal for the top FET gate, enabling the gate contact for the top FET to be placed anywhere on the cap.

Some embodiments of the present disclosure can be illustrated as a semiconductor cell. The semiconductor cell comprises a top field effect transistor (FET) that contains a first set of silicon nanosheets. The semiconductor cell also comprises a bottom FET that contains a second set of silicon nanosheets. The top FET and bottom FET are in a stacked profile. The semiconductor cell also comprises a top FET cutout region that is lateral to the first set of nanosheets and above a portion of the second set of nanosheets. The semiconductor cell also comprises a dielectric fill within the top FET cutout region. This dielectric fill may reduce parasitic capacitance in the top FET cutout region between a gate material and bottom FET contact.

In some of the above embodiments, the semiconductor cell also comprises a top-FET gate material in the top FET and a gate cap formed on the gate material and on the dielectric fill. This gate cap may increase the flexibility of placement for a gate contact for the FET.

In some of the above embodiments, the semiconductor cell also comprises a top-FET gate material in the top FET. The top-FET gate material is formed between the dielectric fill and the first set of silicon nanosheets and upon a top surface of the dielectric fill. This placement of gate material may increase the flexibility of placement for a gate contact for the FET.

In some of the above embodiments, the semiconductor cell may also comprise a gate sidewall that is in the top FET cutout region and between the dielectric fill and the first set of silicon nanosheets. This may increase the contact area between the first set of silicon nanosheets and a gate of the semiconductor cell. In some of these embodiments, the semiconductor cell also comprises a top-FET gate material in the top FET and a gate cap formed on the gate material and on the dielectric fill.

In some of the above embodiments, the semiconductor cell may also comprise a middle dielectric isolation layer between the first set of silicon nanosheets and the second set of silicon nanosheets. In some of these embodiments, the dielectric fill extends to the middle dielectric isolation layer. This may maximize the vertical size of the dielectric fill. In some of these embodiments, the dielectric fill and the middle dielectric isolation layer may be composed of the same material. In some of these embodiments, the semiconductor cell also comprises a top-FET gate material in the top FET and a gate cap formed on the gate material and on the dielectric fill.

In some of the above embodiments, the semiconductor cell may also comprise a middle dielectric isolation layer between the first set of silicon nanosheets and the second set of silicon nanosheets. The semiconductor cell may also comprise a gate material between the dielectric fill and the middle dielectric isolation layer. In some of these embodiments, the dielectric fill and the middle dielectric isolation layer may be composed of the same material. In some of these embodiments, the semiconductor cell also comprises a top-FET gate material in the top FET and a gate cap formed on the gate material and on the dielectric fill.

Some embodiments of the present disclosure can also be illustrated as a semiconductor cell in a set of semiconductor cells. The semiconductor cell in the set of semiconductor cells comprises a top field effect transistor (FET) that contains a first set of silicon nanosheets. The semiconductor cell in the set of semiconductor cells also comprises a bottom FET that contains a second set of silicon nanosheets. The top FET and bottom FET are in a stacked profile. The semiconductor cell in the set of semiconductor cells also comprises a top FET cutout region that is lateral to the first set of nanosheets and above a portion of the second set of nanosheets. The semiconductor cell in the set of semiconductor cells also comprises a dielectric fill within the top FET cutout region.

In some of the above embodiments, the semiconductor cell in the set of semiconductor cells also comprises a top-FET gate material in the top FET and a gate cap formed on the gate material and on the dielectric fill. This gate cap may increase the flexibility of placement for a gate contact for the FET.

In some of the above embodiments, the semiconductor cell in the set of semiconductor cells also comprises a top-FET gate material in the top FET. The top-FET gate material is formed between the dielectric fill and the first set of silicon nanosheets and upon a top surface of the dielectric fill. This placement of gate material may increase the flexibility of placement for a gate contact for the FET.

In some of the above embodiments, the semiconductor cell in the set of semiconductor cells may also comprise a gate sidewall that is in the top FET cutout region and between the dielectric fill and the first set of silicon nanosheets. This may increase the contact area between the first set of silicon nanosheets and a gate of the semiconductor cell. In some of these embodiments, the semiconductor cell also comprises a top-FET gate material in the top FET and a gate cap formed on the gate material and on the dielectric fill.

In some of the above embodiments, the semiconductor cell in the set of semiconductor cells may also comprise a middle dielectric isolation layer between the first set of silicon nanosheets and the second set of silicon nanosheets. In some of these embodiments, the dielectric fill extends to the middle dielectric isolation layer. This may maximize the vertical size of the dielectric fill. In some of these embodiments, the dielectric fill and the middle dielectric isolation layer may be composed of the same material. In some of these embodiments, the semiconductor cell also comprises a top-FET gate material in the top FET and a gate cap formed on the gate material and on the dielectric fill.

In some of the above embodiments, the semiconductor cell in the set of semiconductor cells may also comprise a middle dielectric isolation layer between the first set of silicon nanosheets and the second set of silicon nanosheets. The semiconductor cell may also comprise a gate material between the dielectric fill and the middle dielectric isolation layer. In some of these embodiments, the dielectric fill and the middle dielectric isolation layer may be composed of the same material. In some of these embodiments, the semiconductor cell also comprises a top-FET gate material in the top FET and a gate cap formed on the gate material and on the dielectric fill.

Some embodiments of the present disclosure can also be illustrated as a set of semiconductor cells. The set of semiconductor cells comprises a first semiconductor cell with a first top FET cutout region. A first dielectric fill is formed within the first top FET cutout region. The set of semiconductor cells also comprises a second semiconductor cell with a second top FET cutout region. A second dielectric fill is formed within the second top FET cutout region. The first and second dielectric fills may prevent parasitic capacitance between components of the semiconductor cells.

In some of the above embodiments, the first dielectric fill and the second dielectric fill are the same dielectric fill.

In some of the above embodiments, the set of semiconductor cells also comprises a gate cap formed upon a top surface of the dielectric fill. the gate cap spans the width of the first semiconductor cell and the second semiconductor cell. This may enable the first dielectric cell and the second dielectric cell to be electrically switched simultaneously. In some of these embodiments, the first dielectric fill and the second dielectric fill are the same dielectric fill.

In some of the above embodiments, the set of semiconductor cells also comprises a gate cut through between the first dielectric fill and the second dielectric fill. This may enable isolation between the first semiconductor cell and second semiconductor cell.

In some of the above embodiments, the set of semiconductor cells also comprises a third semiconductor cell located horizontally with respect to the first semiconductor cell from a cross-gate-cut view perspective. The third semiconductor cell comprises a third top FET cutout region. The third dielectric fill is formed within the third top FET cutout region. This dielectric fill may prevent parasitic capacitance between components of the semiconductor cells.

FIGS. 1A and 1B, for example depict a cell 100 in a stacked FET design in which the gate material from a top FET cutout region has been replaced by dielectric material, in accordance with embodiments. As noted in the legend 101, FIG. 1A represents a cross-sectional view as if cell 100 were sliced in the A dimension, and FIG. 1B represents a cross-sectional view as if cell 100 were sliced in the Y dimension. The cross-sectional view presented in 1A (and similar figures such as 2A, 3, and 4,) is referred to herein as an along-gate cut. The cross-sectional view presented in FIG. 1B (and similar figures such as 2B) is referred to herein as a cross-gate cut. Unless otherwise specified explicitly or by the context surrounding the use, relational, positional, and measurement terms such as "left of," "above," "between," "below," "width," "height," "depth," etc. describing one or more components are to be interpreted as those components are presented in an along-gate cut, such as in FIG. 1A.

Cell 100 contains a silicon substrate 102 on which a bottom FET 104 is patterned. Top FET 106 is patterned upon bottom FET 104, and top FETS 104 and 106 are separated by a middle dielectric isolation sheet 108.

Bottom FET 104 contains silicon nanosheets 110A and 110B and gate material 112, which is formed of a first work function metal. Top FET 106 contains silicon nanosheets 114A, 114B, 114C, and 114D, and gate material 116, which is formed of a second work function metal. Top FET 106 also contains dielectric fill 118, which may be formed of the same dielectric material as middle dielectric isolation sheet 108. In some embodiments, a dielectric material that has a particularly low dielectric constant may be chosen for dielectric fill 118.

Top FET 106 is also covered with gate cap 120, which, because it is formed of the same work function metal as gate material 116, forms a part of the gate for top FET 106.

The top FET cutout region of top FET 106 is defined in FIG. 1A by the area between the very right side of silicon nanosheets 114A-114D and the very right side of dielectric fill 118 and between the very top of dielectric fill 118 and the very bottom of gate cap 120. In this way, the top FET cutout region represents the of top FET 106 that was removed when silicon nanosheets 114A-114D were etched. This will be shown more clearly in FIGS. 2A through 2DD.

Thus, dielectric fill 118 occupies almost the entire top FET cutout region for top FET 106. A small gate sidewall 122 remains in the top FET cutout region between silicon nanosheets 114A-114D, which may increase the surface area between silicon nanosheets 114A-114D and gate material 116. The width of this gate sidewall 122, as measured in the dimension running from the left side of the page to the right side of the page, may be designed to be as small as practical in order to reduce parasitic capacitance of gate material 116 in the top FET cutout region. However, in some embodiments it may be preferable for the width of gate sidewall 122 to be approximately equal to the height of the gate sheets between the silicon nanosheets.

For example, gate sheet 124, located between silicon nanosheets 114B and 114C, has a height (measured in the dimension running from the bottom of the page to the top of the page) between the top surface of silicon nanosheet 114B and the bottom surface of silicon nanosheet 114C that is approximately equal to the width of gate sidewall 122 between the right surface of silicon nanosheets 114A-114D and the left surface of dielectric fill 118. Forming cell 100 such that the width of gate sidewall 112 and the height of gate sheet 124 may, for example, result in a consistent gate contact area throughout silicon nanosheets 114A-114D. Similarly, in some embodiments, the gate sidewall to the left of silicon nanosheets 114A-114D may also be formed to be of equal width of gate sidewall 122 (though such an embodiment is not pictured in FIG. 1A.

Of note, in some embodiments dielectric fill 118 may not reach all the way to middle dielectric isolation sheet 108. For example, in some embodiments the timing of etching the void within the top FET cutout region may be difficult to control precisely. In these embodiments, the etching may be stopped slightly early, before reaching middle dielectric isolation sheet 108, in order to avoid etching into bottom FET 104. However, in embodiments such as the embodiment shown in FIG. 1A, the etchant used to form the void within the top FET cutout region may be selective to middle dielectric isolation sheet 108. In these embodiments, middle dielectric isolation sheet 108 may act as an etch stop when forming the void, and thus dielectric fill 118 would interface with middle dielectric isolation sheet 108 when the void is filled.

Of further note, the FIGS. 1A, 1B, and the remaining figures illustrated within do not necessarily include all components and materials that may be present within the depicted FETs and cells. This is for the sake of presenting a more easily understandable depiction of the components that are presented. For example, adhesion and barrier layers may be formed between many components of the figures, but are often not depicted in the figures. More specifically, in some embodiments of semiconductor cells herein, a gate may take the form of a high-K metal gate that comprises both gate material (i.e., work function metal) and a high-K gate insulator layer (sometimes referred to herein as a "gate insulator" or "insulator liner"). This high-K gate insulator layer may be formed of, for example, hafnium oxide, and may be applied to the surfaces of silicon sheets and gate spacers (e.g., gate spacers 228) before application of gate material.

Again of further note, in some figures, a distinct, identifiable interface between two components of the same material may be illustrated for the sake of understanding, even when that interface may not be distinct in practice. This is to emphasize, again for the sake of understanding, that the two components were added at separate stages. This distinct depiction, however, is not necessarily intended to imply that any interface between two components of the same material would be identifiable in practice. An example of this can be viewed in FIG. 1A in the distinct interface between the top surface of gate material 116 and gate cap 120. In practice, because these components are formed of the same work function metal, they may meld together and form a single component.

Finally, it is important to note that the relative proportions of components in FIGS. 1A, 1B, and the remaining figures of this disclosure are, unless otherwise noted, chosen for the sake of understanding, not necessarily to imply a required relationship between those components in practice. Thus, the relative lengths, widths, depths, and heights of components as illustrated may be different in practice. For example, ratio between the width of nanosheet 114D to the height of nanosheet 114D may be illustrated as significantly larger in FIG. 1A than it would be in real-world use cases. Similarly, the ratio between the width of nanosheet 114D to the height of gate cap 120 may be illustrated as significantly smaller in FIG. 1A than it would be in real-world use cases.

Similarly, ratios of the numbers and sizes of nanosheets in illustrated top FETs to the numbers and sizes of nanosheets in illustrated bottom FETs may be larger or smaller in real-world use cases. In some real-world use cases, for example, it may be beneficial for the total surface area of nanosheets 110A-110B that is exposed to gate material 112 to be approximately equal to the total surface area of nanosheets 114A-114D that is exposed to gate material 116. Therefore, as the ratio of the width of nanosheets 114A-114D to the width of nanosheets 110A-110B decreases, more nanosheets may be required in top FET 106 to account for the decreased relative width and to cause the surfaces areas of the nanosheets in both top FET 104 and top FET 106 to be approximately equal.

Figures 2A, 2B:
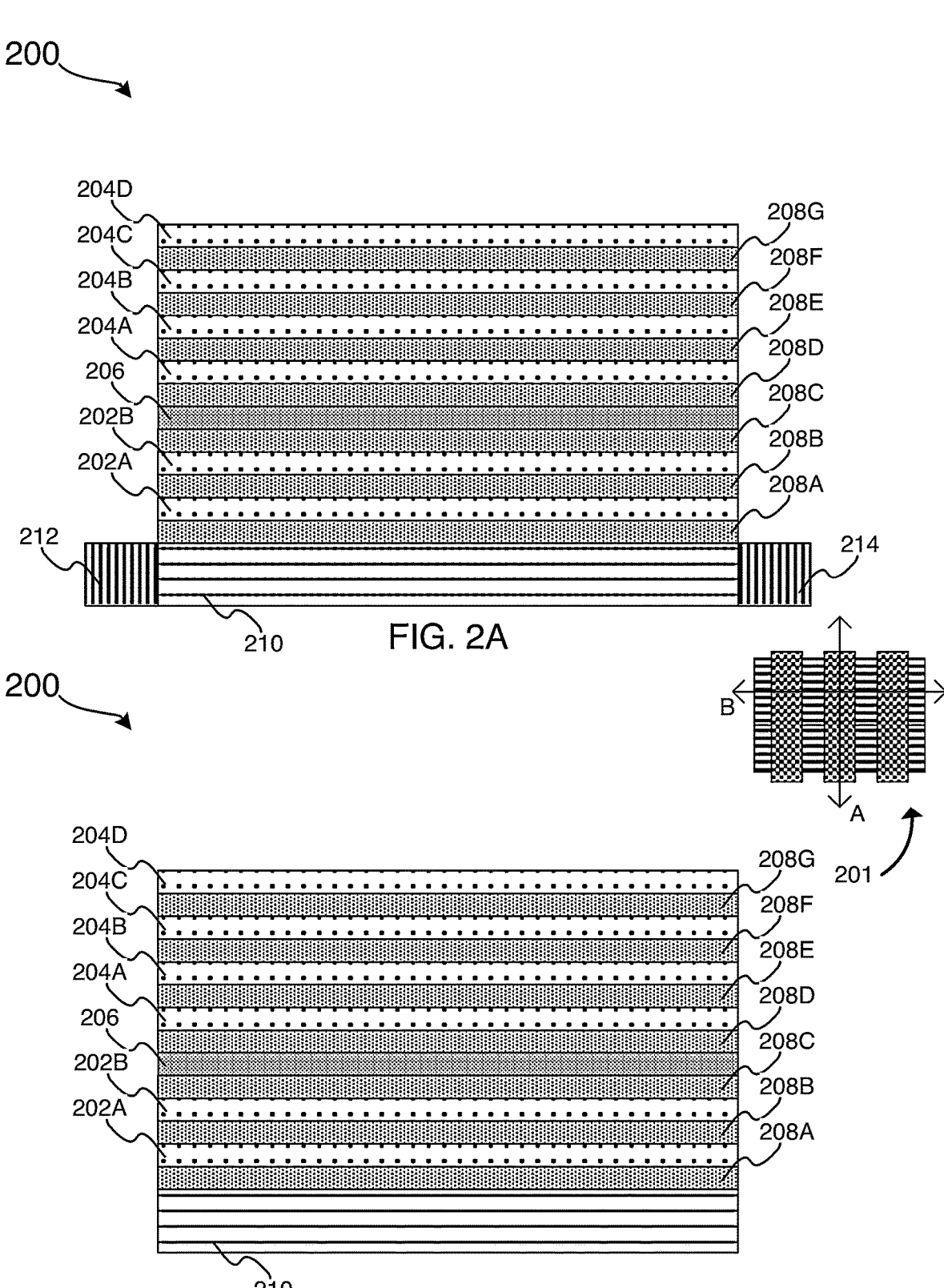
FIGS. 2A-2DD depict various stages in an example process of forming a semiconductor cell in a stacked FET profile with a top FET cutout region that is filled with a dielectric material, in accordance with embodiments of the present disclosure.

FIGS. 2A-2DD depict various stages in an example process of forming a semiconductor cell 200 in a stacked FET profile with a top FET cutout region that is filled with a dielectric material. Of note, FIGS. 2A-2DD, like FIGS. 1A-1B, are presented as cross sections semiconductor cell 200. Throughout FIGS. 2A-2DD, the figure views on the top of the sheet represent the view of cross section A illustrated in legend 201. The figure views on the bottom of the sheet represent the view of cross section B illustrated in legend 201. For example, FIG. 2A illustrates the cross section view A, and FIG. 2B illustrates the cross section view B.

FIGS. 2A and 2B, for example, illustrate a first stage in forming semiconductor cell 200. In this stage, two sets of semiconductor nanosheets have been patterned upon silicon substrate 210. Specifically, silicon nanosheets 202A and 202B (sometimes collectively referred to herein as "nanosheets 202") represent the first set and silicon nanosheets 204A, 204B, 204C, and 204D (sometimes collectively referred to herein as "nanosheets 204") represent the second set. The first set of nanosheets 202 are separated by the second set of nanosheets 204 by a layer of silicon germanium 206 (sometimes referred to herein as "SiGe layer 206" or even simply "SiGe 206") of a particular percentage of germanium. SiGe layer 206 may be, for example, 55 percent germanium, also referred to as SiGe55.

Each of the nanosheets within nanosheets 202 and 204 are separated by a layer of silicon germanium from another set of silicon germanium layers. Specifically, silicon germanium layers 208A, 208B, 208C, 208D, 208E, 208F, and 208G separate the nanosheets within nanosheets 202 and 204 from each other and from SiGe layer 206. Silicon germanium layers 208A-208G (sometimes collectively referred to herein as "silicon germanium layers 208") may be of a percentage of germanium that differs from the percentage of germanium in SiGe layer 206. For example, silicon germanium layers 208 (sometimes referred to herein as "SiGe layers 208") may be, for example 30 percent germanium, also referred to as SiGe30.

Of note, FIG. 2A also illustrates shallow trench isolation features 212 and 214.

Figure 2C:
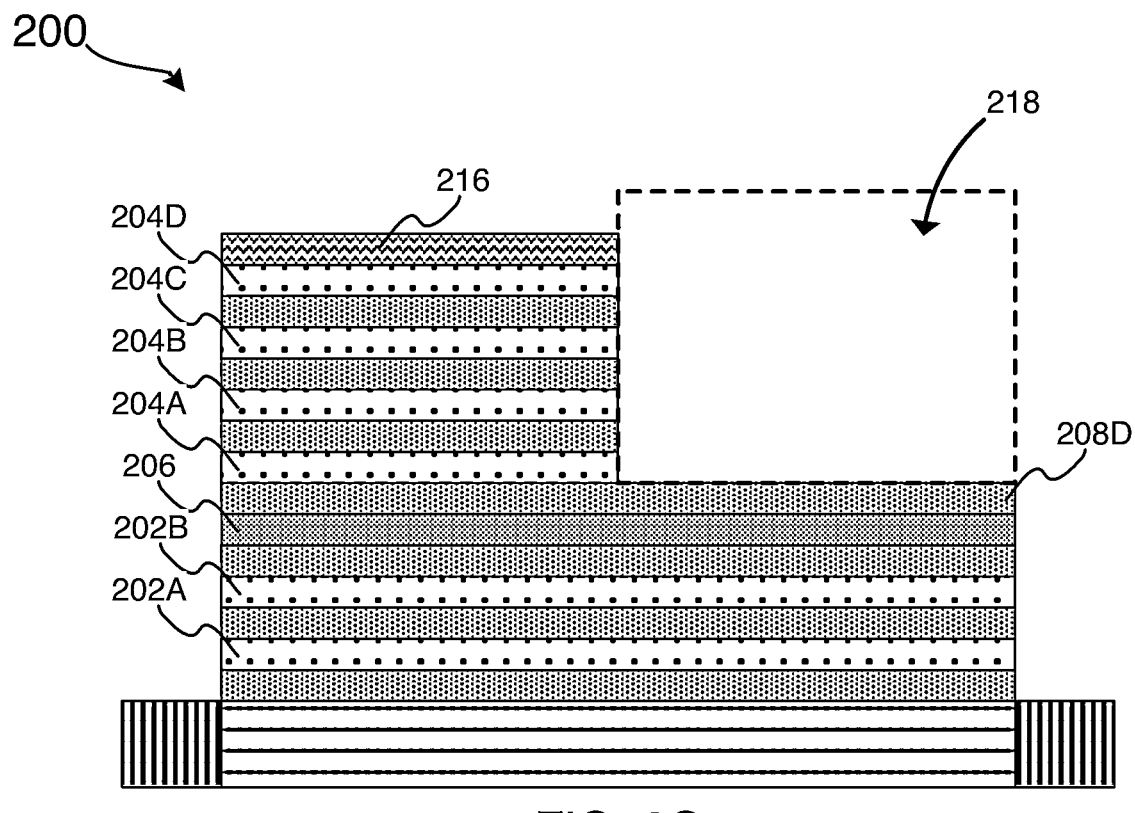
Figure 2D:
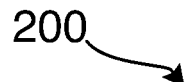

FIGS. 2C and 2D illustrate a second stage in forming semiconductor cell 200. In this stage, a hardmask 216 has been applied to the left side of silicon nanosheet 204D, as illustrated in the view of FIG. 2C. A directional etch was then performed upon semiconductor cell 200, resulting in top FET cutout region 218, illustrated in FIG. 2C by a dashed line. In some embodiments, this etch may be performed with an etchant that is selective to hardmask 216 and SiGe layer 208D, such that hardmask 216 protects nanosheet 204D from etching and such that SiGE layer 208D acts as an etch stop. Of note, in some embodiments, the etchant may be selective not to SiGe layer 208D, but rather to SiGe layer 206, in which case the top FET cutout region 218 would extend to SiGe layer 206.

Figure 2E:
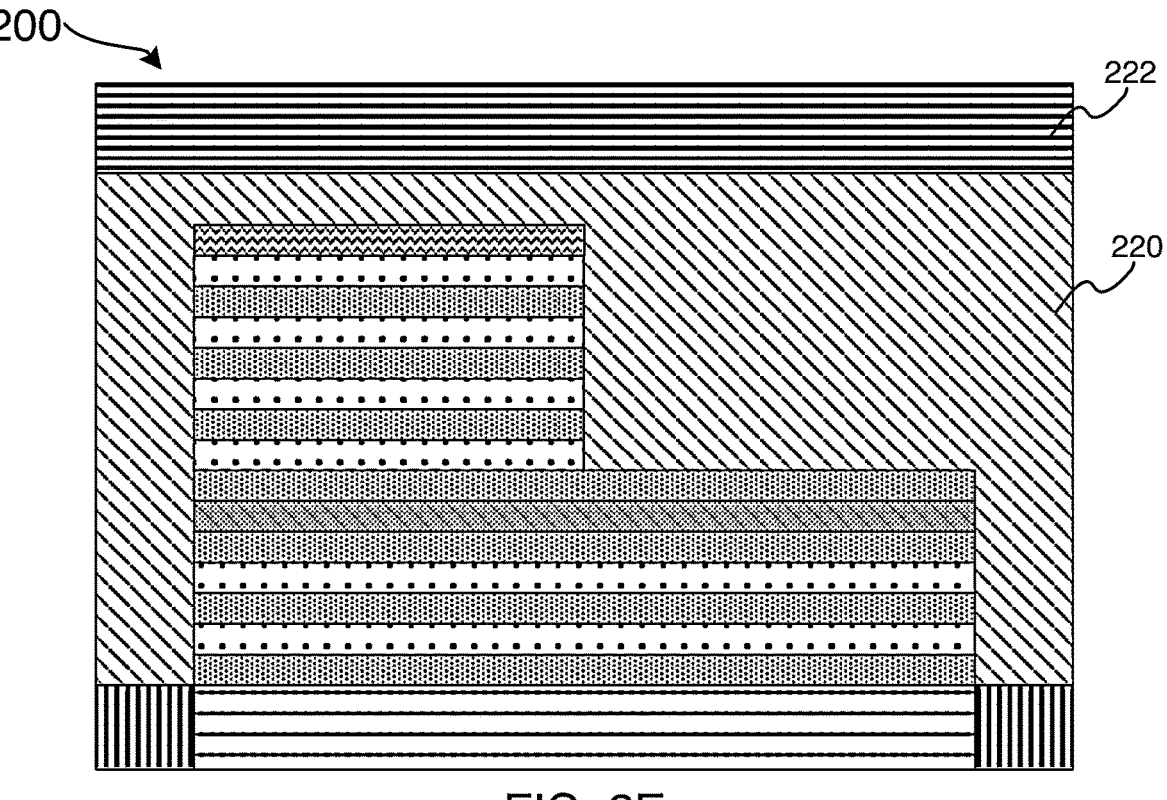
Figure 2F:
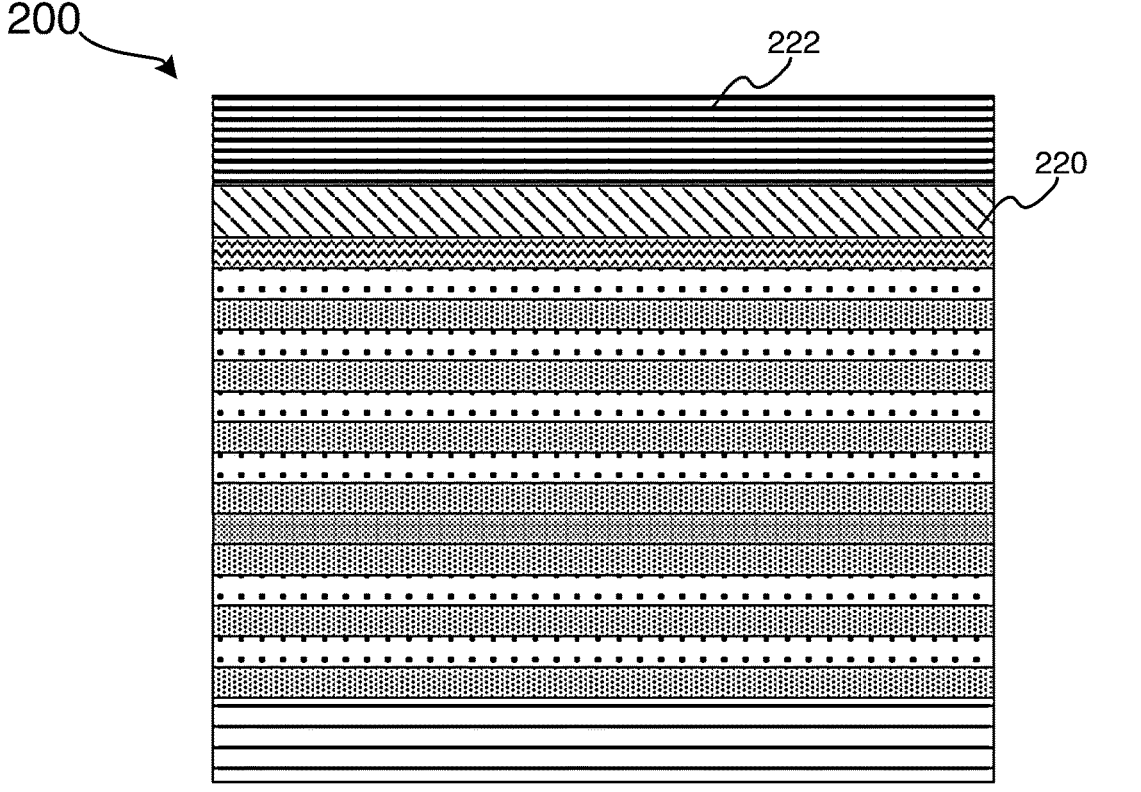

FIGS. 2E and 2F illustrate a third stage in forming semiconductor cell 200. In this stage, a dummy gate material 220 and hardmask material 222 have been applied to semiconductor cell 200.

Figure 2G:
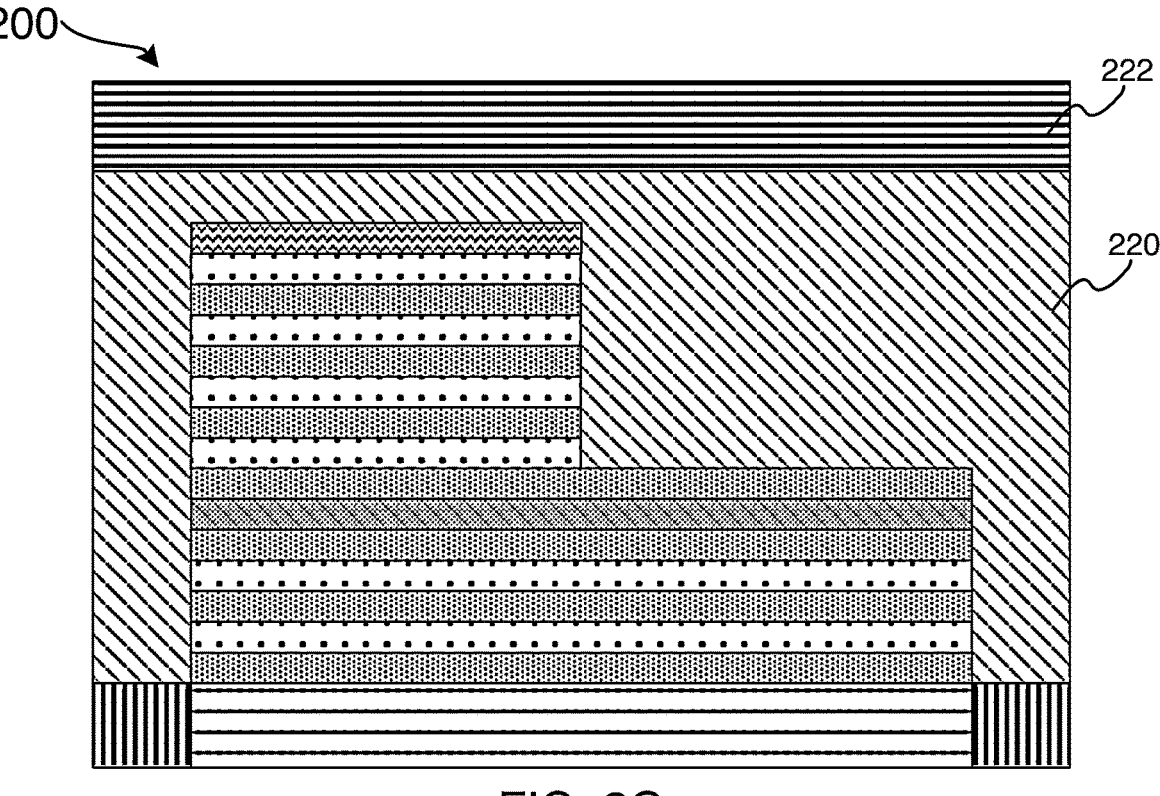
Figure 2H:
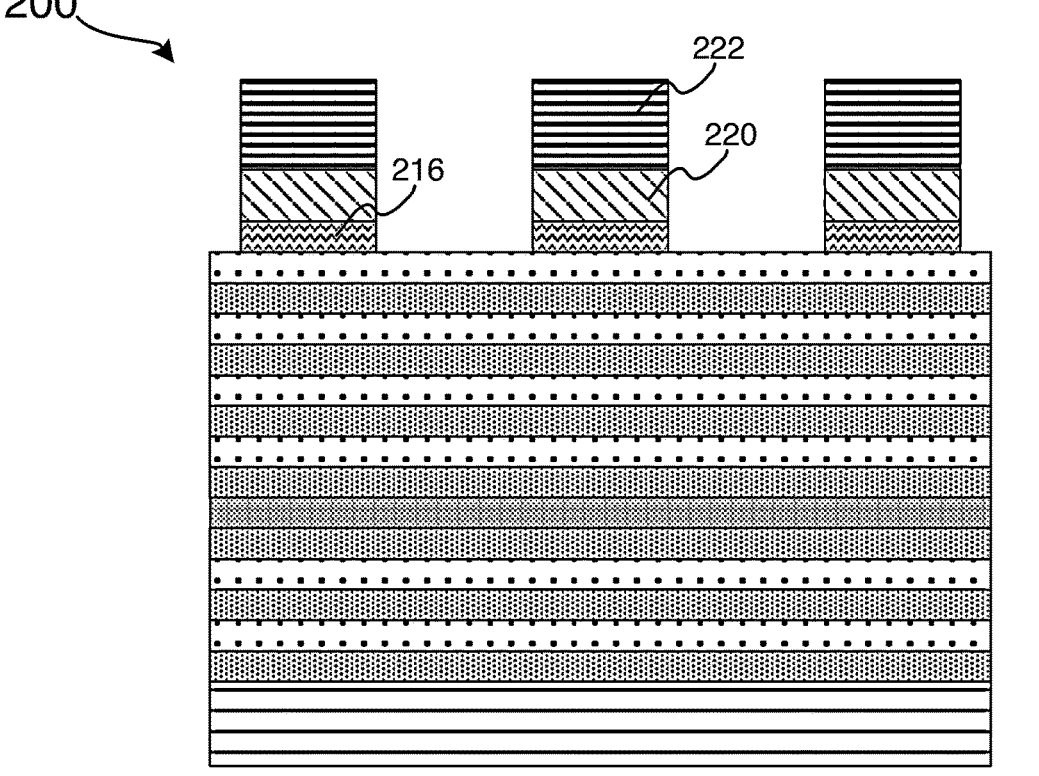

FIGS. 2G and 2H illustrate a fourth stage in forming semiconductor cell 200. In this stage, dummy gate material 220, hardmask 222, and hardmask 216 are patterned using reactive ion etching. This results in gaps in the view illustrated in FIG. 2H, which can later be used for patterning source and drain diffusion epitaxial regions.

Figure 2I:
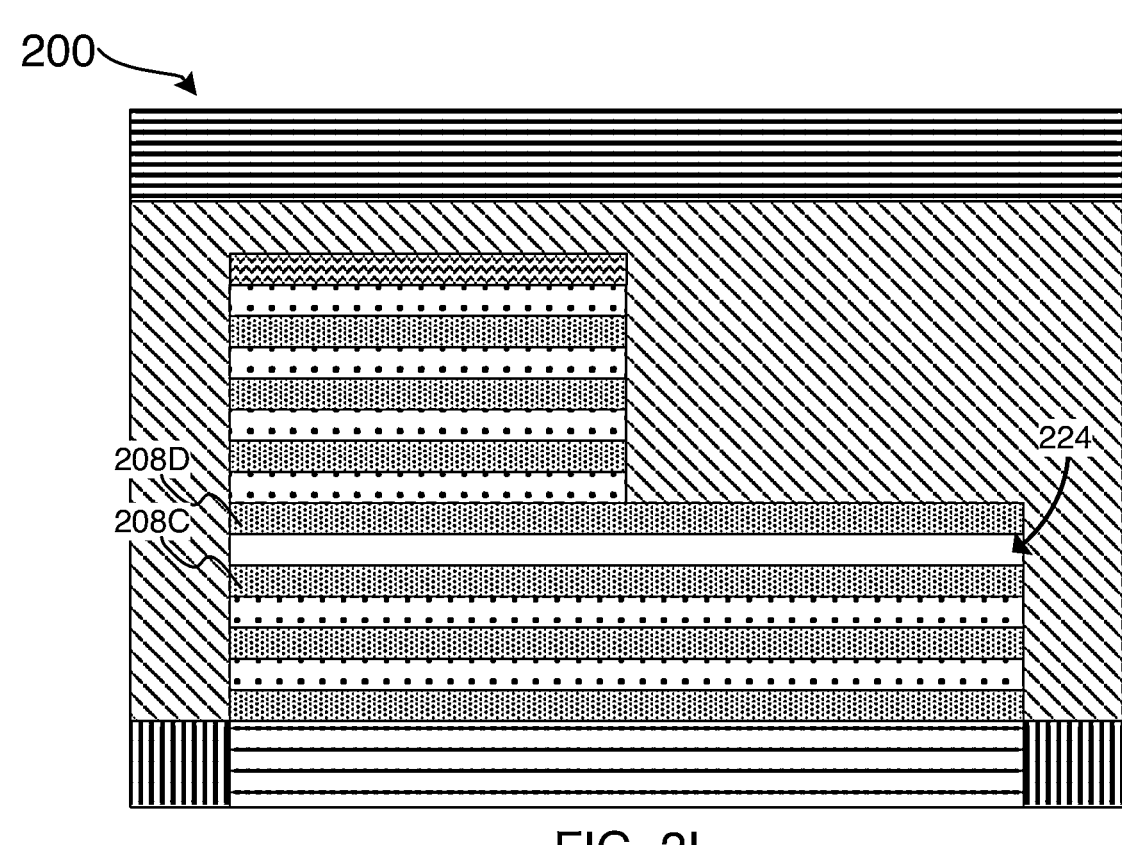
Figure 2J:
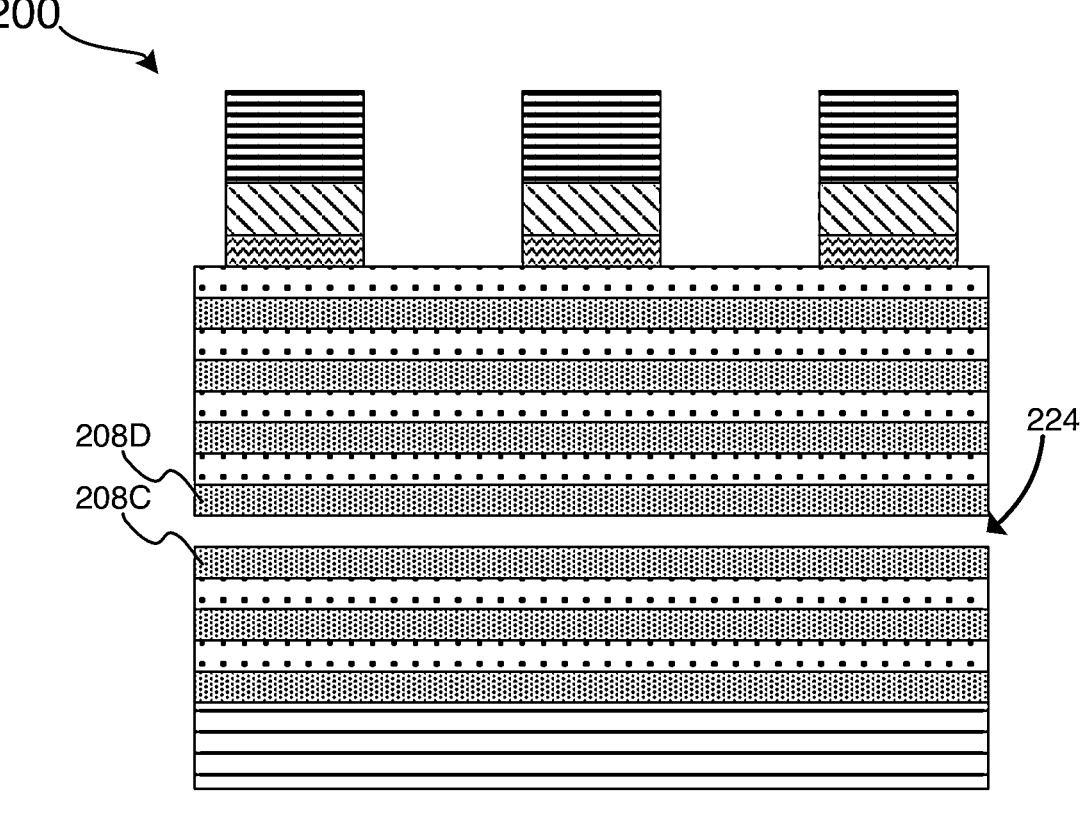

FIGS. 2I and 2J illustrate a fifth stage in forming semiconductor cell 200. In this stage, SiGe layer 206 has been removed, leaving a void 224 between SiGe layers 208C and 208D. SiGe layer 206 could be removed through a dry selective etch, a vapor phase HCl process, or a reactive ion etch. For example, SiGe layer 206 could be etched by a solution of solution of $NH_4OH$, $H_2O_2$, or $H_2O$ that is selective to SiGe layers 208A-208G but not to SiGe layer 206.

Figure 2K:
Figure 2K:
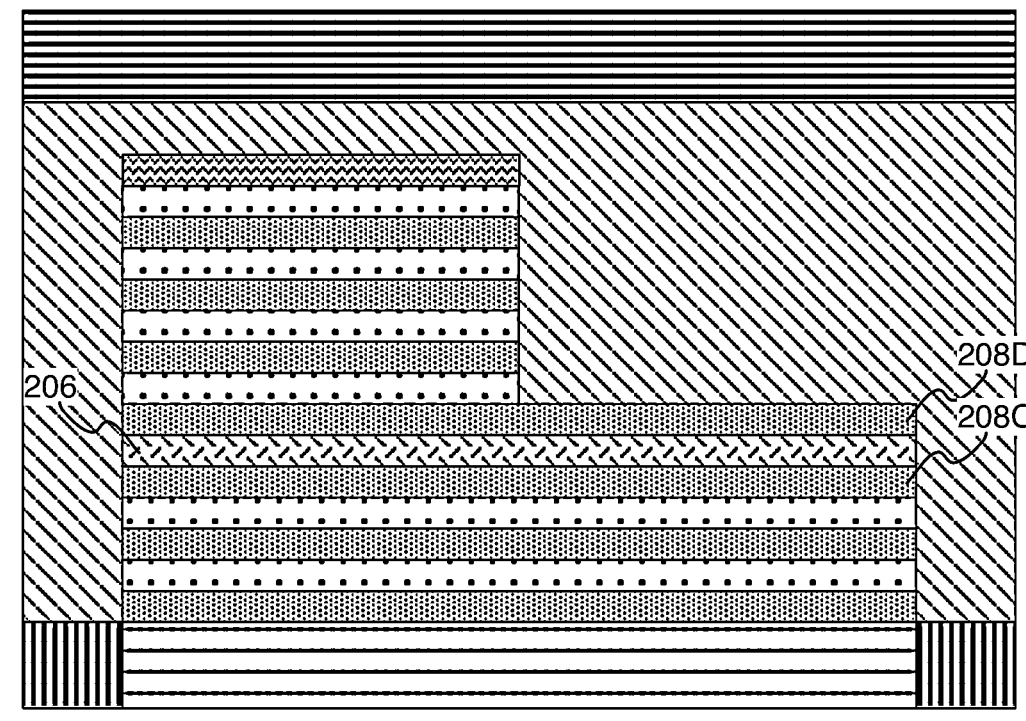
Figure 2L:
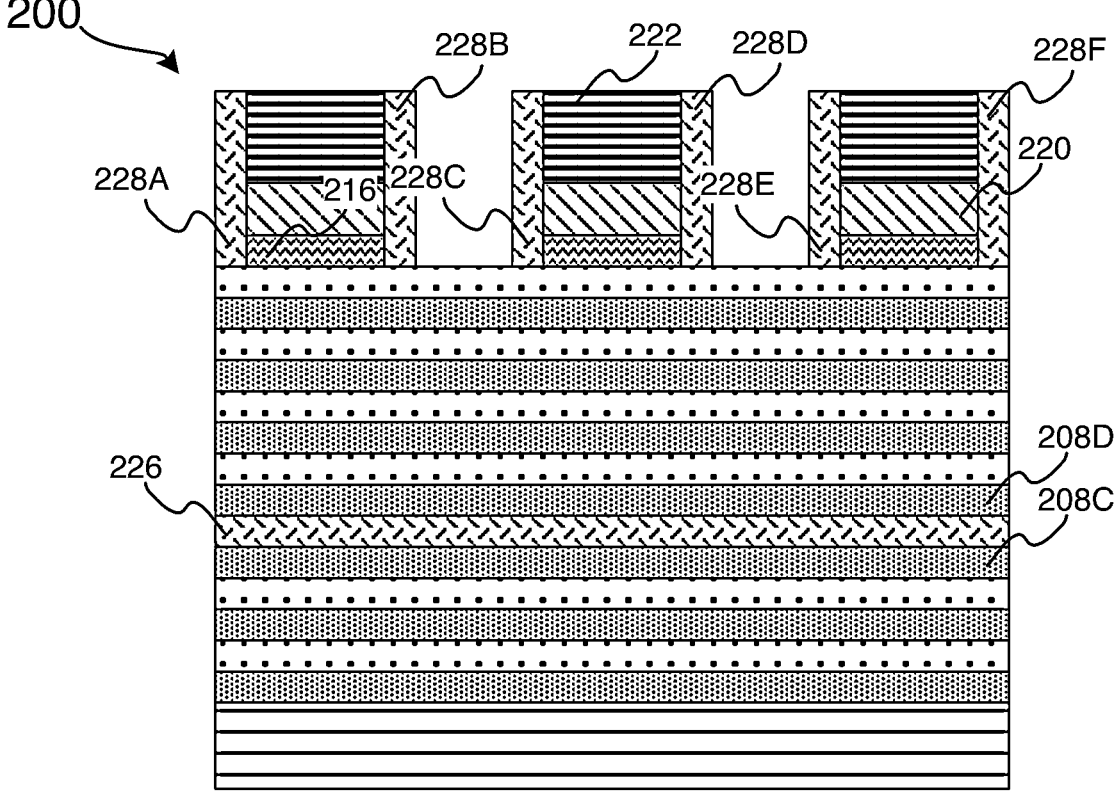

FIGS. 2K and 2L illustrate a sixth stage in forming semiconductor cell 200. In this stage, void 224 has been filled with dielectric material to create middle dielectric isolation layer 226 (sometimes referred to herein as "MDI layer 226" or simply "MDI 226"). MDI 226 could be formed of a dielectric with a low dielectric constant (sometimes referred to herein as a "low-K dielectric"), such as silicon oxycarbonitride (SiOCN). Similarly, gate spacers 228A, 228B, 228C, 228D, 228E, and 228F (sometimes collectively referred to as "gate spacers 228") have been applied on the sides of the openings of the gaps within hardmask 216, dummy gate material 220, and hardmask 222. Gate spacers 228 may be composed of, for example, $SiO_2$, SiOC, or another low-K dielectric.

Figure 2M:
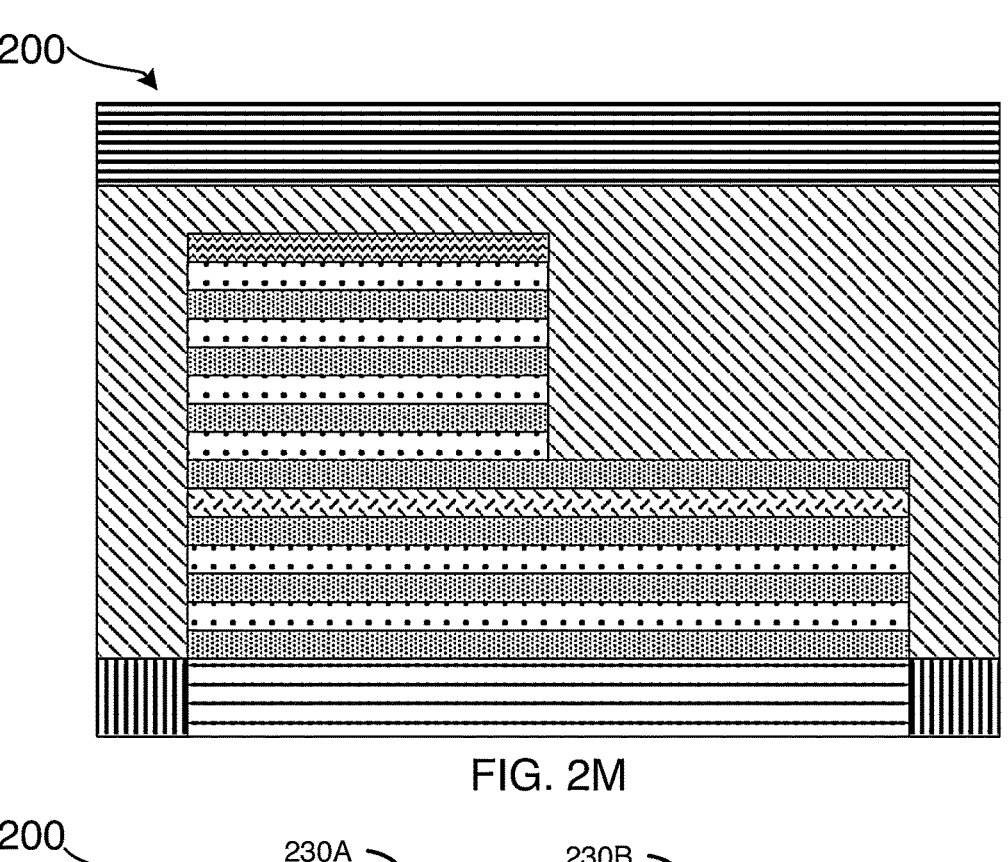
Figure 2N:
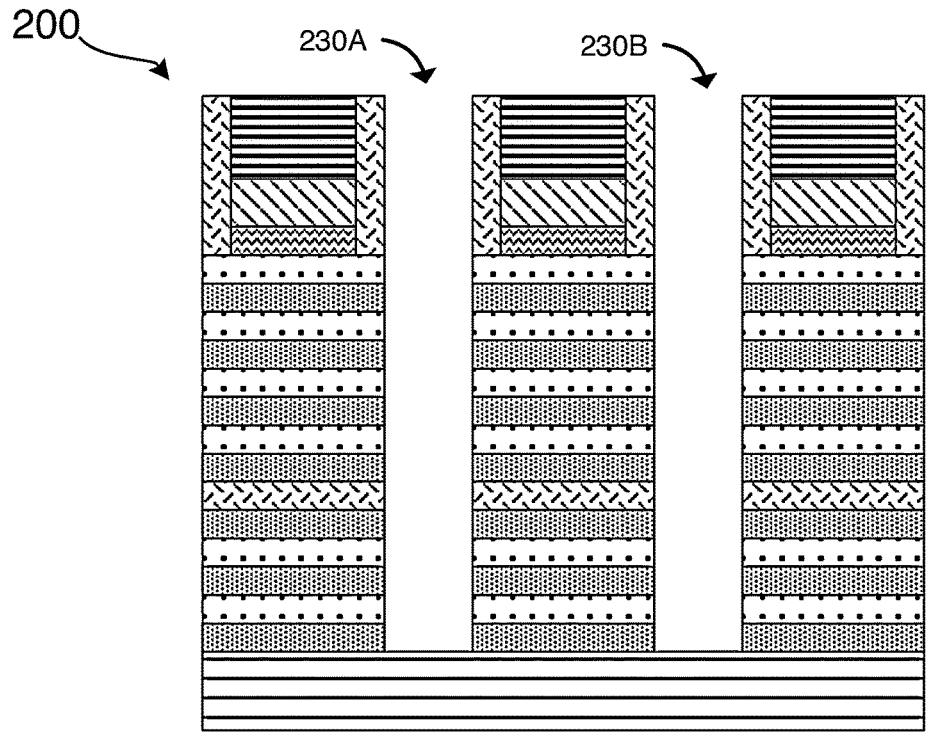

FIGS. 2M and 2N illustrate a seventh stage in forming semiconductor cell 200. In this stage, a direction etch, such as a reactive ion etch, has been performed to create the wells 230A and 230B. Wells 230A and 230B may be used later in the process to form diffusion regions for semiconductor cell 200.

Figure 2O:
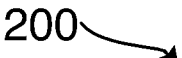
Figure 2O:
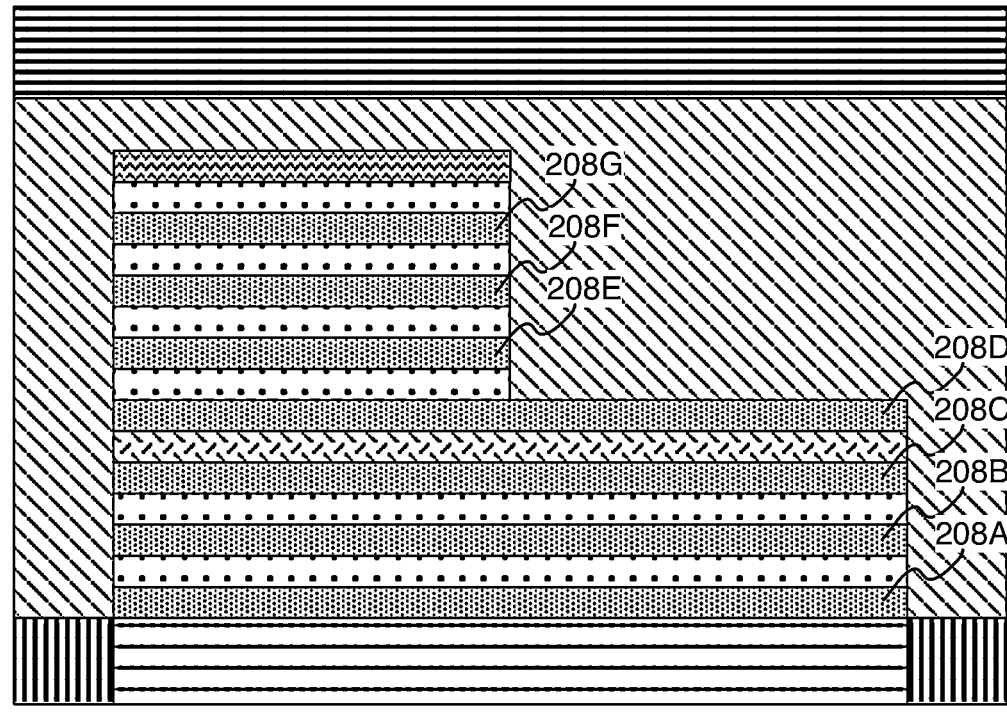
Figure 2P:
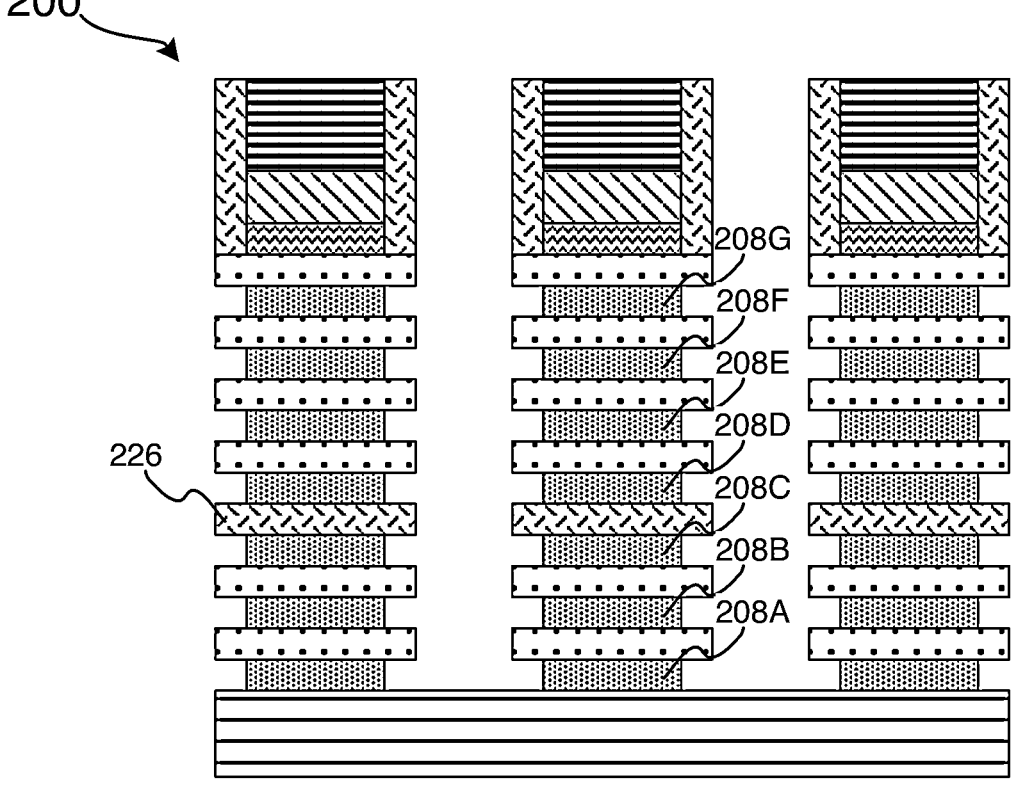

FIGS. 2O and 2P illustrate an eighth stage in forming semiconductor cell 200. In this stage, SiGe layers 208 are indented using an etch solution that is selective to the non-SiGe components of semiconductor cell 200. For example, if SiGe layers 208 were composed of 30% germanium (i.e., SiGe30), SiGe layers 208 could have been etched with a dry selective etch, vapor phase HCl process, or reactive ion etching. This has resulted in partial voids, also referred to as insets, between the silicon nanosheets and MDI 226.

Figure 2Q:
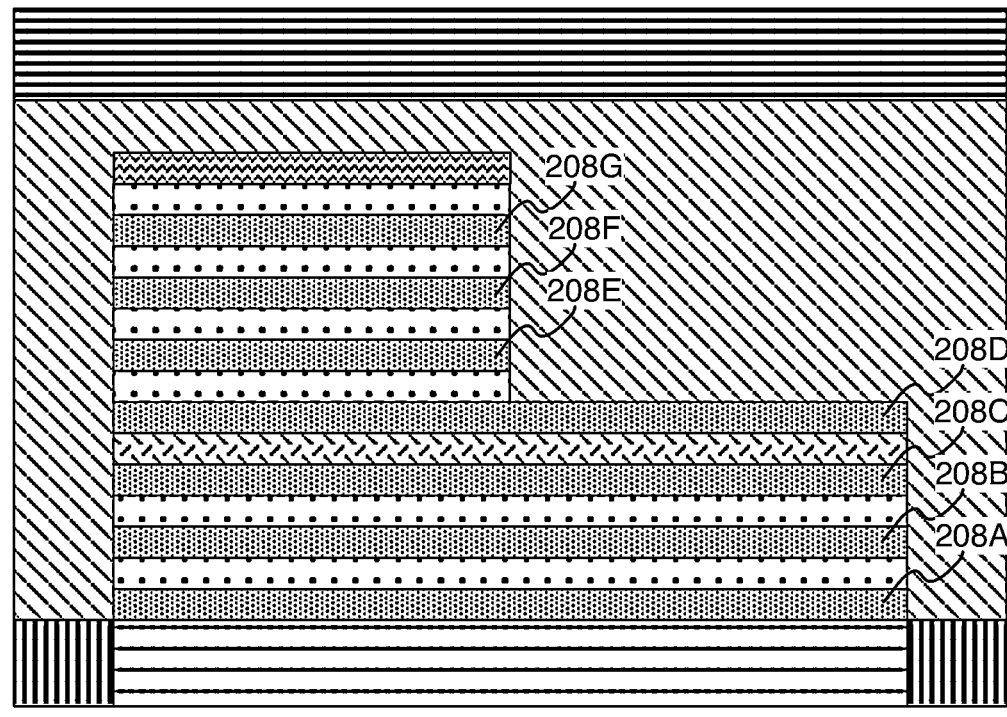
Figure 2R:
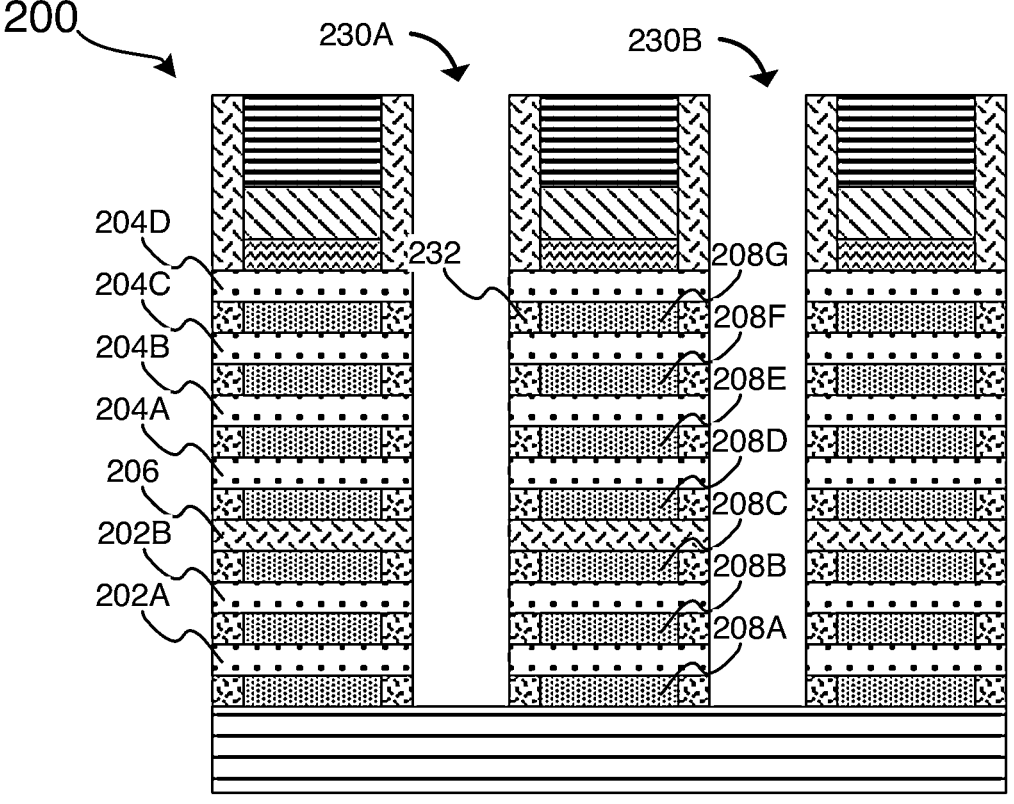

FIGS. 2Q and 2R illustrate a ninth stage in forming semiconductor cell 200. In this stage, the insets formed in the eighth stage (illustrated in FIGS. 2O and 2P) have been filled with inner spacers, illustrated herein with example inner spacer 232. In some embodiments, these inner spacers may be formed of silicon oxide, silicon nitride, silicon oxynitride, SiBCN, SiOCN, SiOC, or any suitable combination of those materials. In some embodiments, this fill may have been performed through a conformal deposition (e.g., epitaxial growth) of the inner spacer material on the exposed surfaces of SiGe layers 208. In some embodiments, this conformal deposition may have also occurred on the exposed surfaces of silicon nanosheets 202 and 204, MDI layer 206, or both. After the initial deposition of the spacer material, a directional etch may be performed on semiconductor cell 200 to remove the inner spacer material from wells 230A and 230B.

Figure 2S:
Figure 2S:
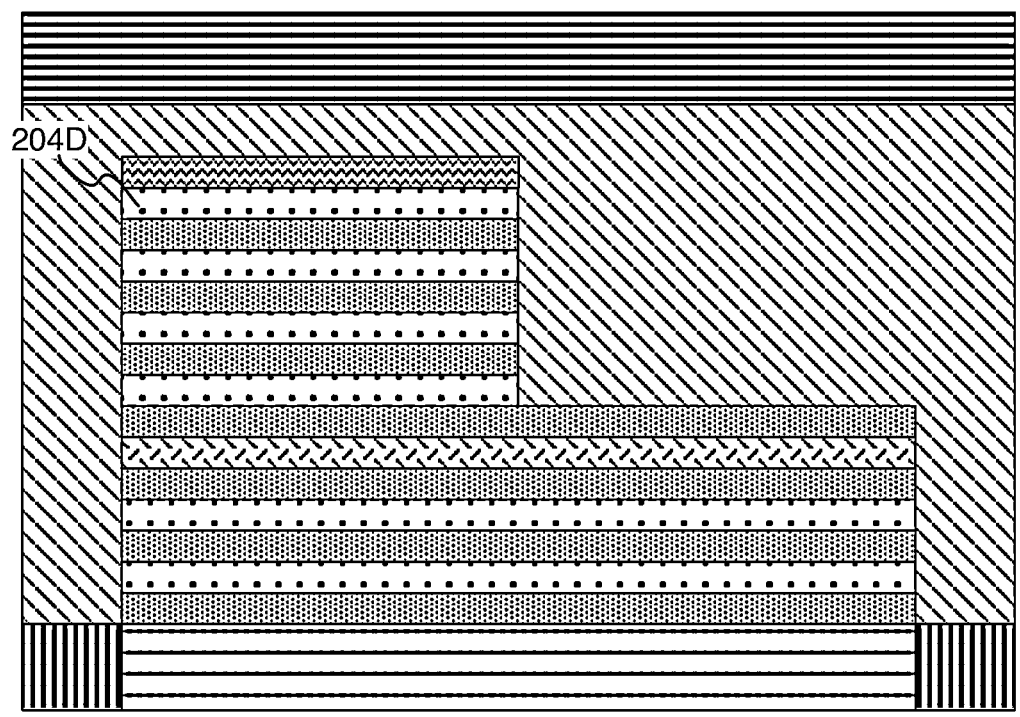
Figure 2T:
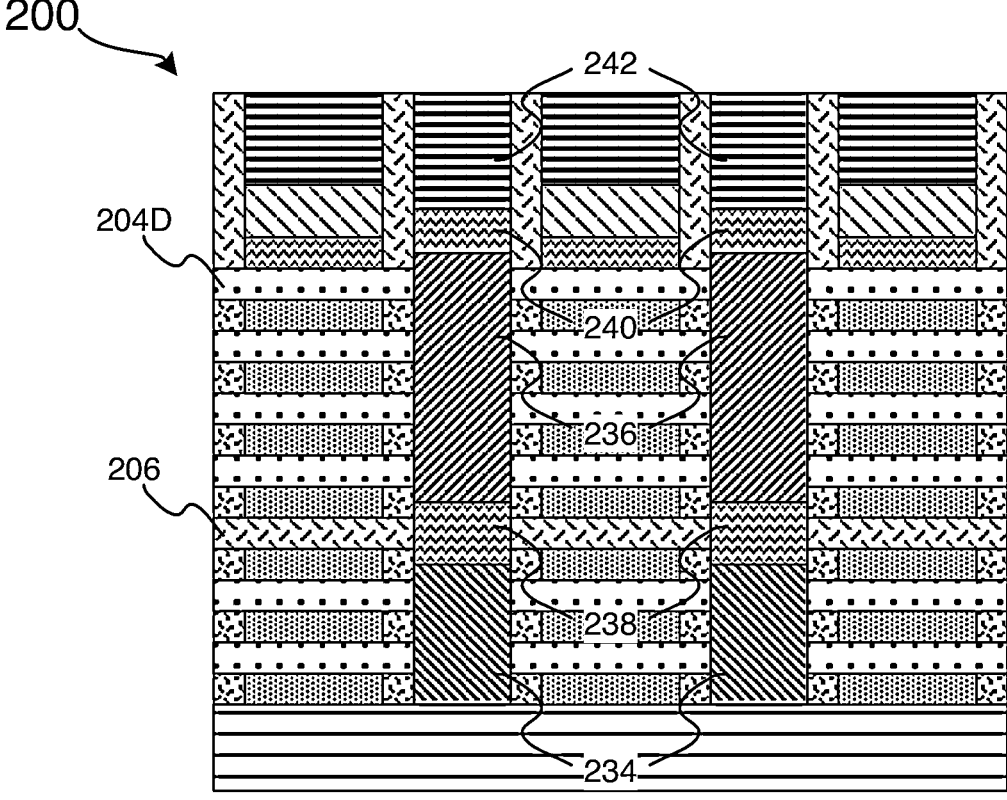

FIGS. 2S and 2T illustrate a tenth stage in forming semiconductor cell 200. In this stage, bottom FET diffusion regions 234 and 236 are formed within wells 230A and 230B (no longer present in FIGS. 2S and 2T). Diffusion regions 234 may have been formed, for example, through epitaxial growth of doped silicon (e.g., silicon doped with boron, aluminum, gallium, or indium for a p-type diffusion region, silicon doped with phosphorus, arsenic, antimony, bismuth, or lithium for an n-type diffusion region) on the exposed surfaces of wells 230A and 230B. This doped silicon may have been etched to a level below MDI layer 206, after which inter-layer dielectrics 238 may have been formed upon the diffusion regions 234. The inter-layer dielectrics 238 may be formed, for example, of silicon dioxide ($SiO_2$).

Inter-layer dielectrics 238 may then have been planarized through chemical-mechanical planarization (sometimes referred to herein as "CMP"), after which diffusion regions 236 may have been formed within wells 230A and 230B in a process similar to that in which diffusion regions 234 were formed. Diffusion regions 236 may also be etched to a level just above the top surface of nanosheet 204D. Dielectric capping layers 240 may have then been formed upon the diffusion regions 236. Dielectric capping layers 240 may have been formed in the same way that inter-layer dielectrics 238 may have been formed, and may also be formed, for example, of $SiO_2$. Dielectric capping layer 240 may have been planarized through CMP, after which it may have been recessed. Hardmasks 242 may then have been deposited upon the dielectric capping layer 240, after which hardmasks 242 may have been planarized using CMP.

Figure 2U:
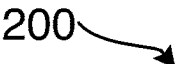
Figure 2U:
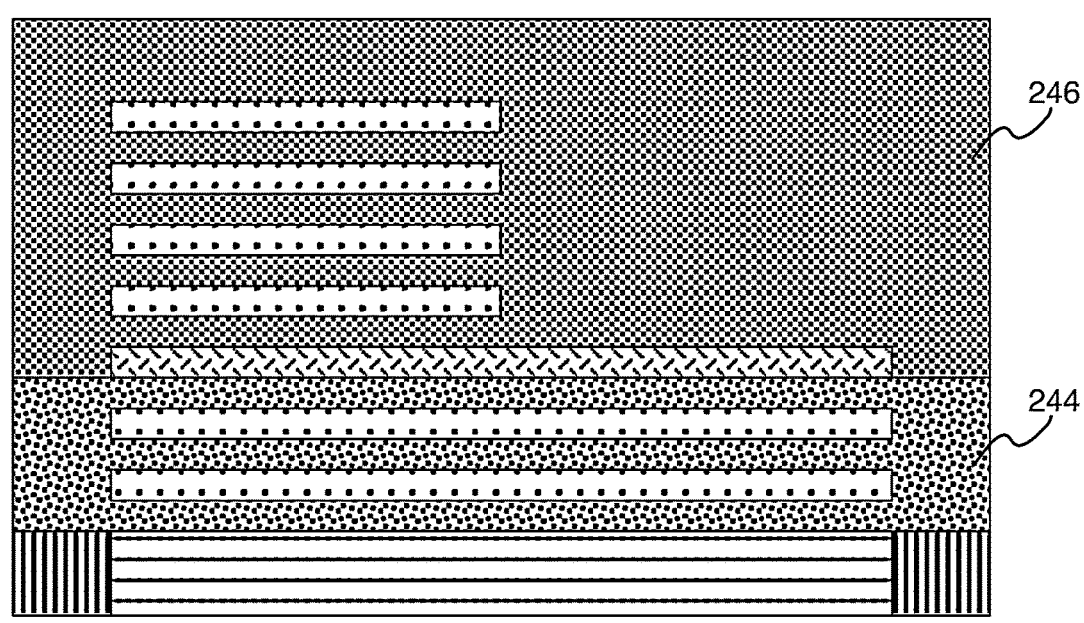
Figure 2V:
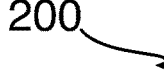
Figure 2V:
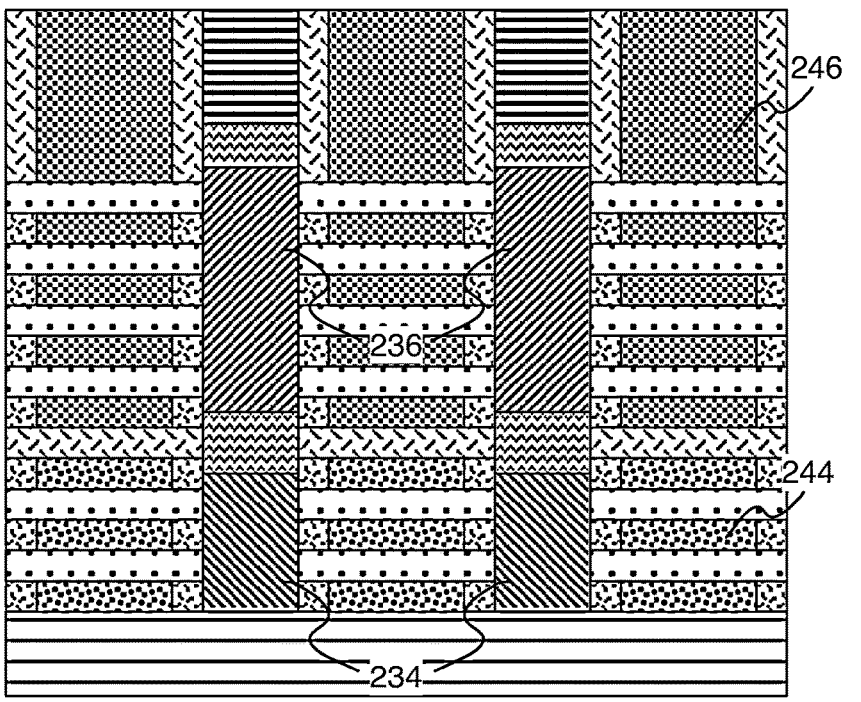

FIGS. 2U and 2V illustrate an eleventh stage in forming semiconductor cell 200. In this stage, dummy gate material 220 and hardmask 222 have been removed, and dummy gate material 220 has been replaced by gate material 244 and 246. Gate material 244 represents the gate for the bottom FET in semiconductor cell 200, and gate material 246 represents the gate for the top FET in semiconductor cell 200. Gate materials 244 and 246 may be formed of work function metals corresponding to the FETs that will be formed within semiconductor cell 200. For example, if the bottom FET takes the form of an nFET (i.e., diffusion regions 234 are n-doped), gate material 244 would take the form of an n-work-function-metal (e.g., titanium nitride (TiN). In that case, gate material 246 would take the form of a p-work-function-metal (e.g, tungsten (W).

Note that, as illustrated, two different gate materials 244 and 246 have been formed within semiconductor cell 200. However, in some embodiments a single gate material with a single work function metal may be added. In those embodiments, gate materials 244 and 246 would be a single component with a single work function metal.

Figure 2W:
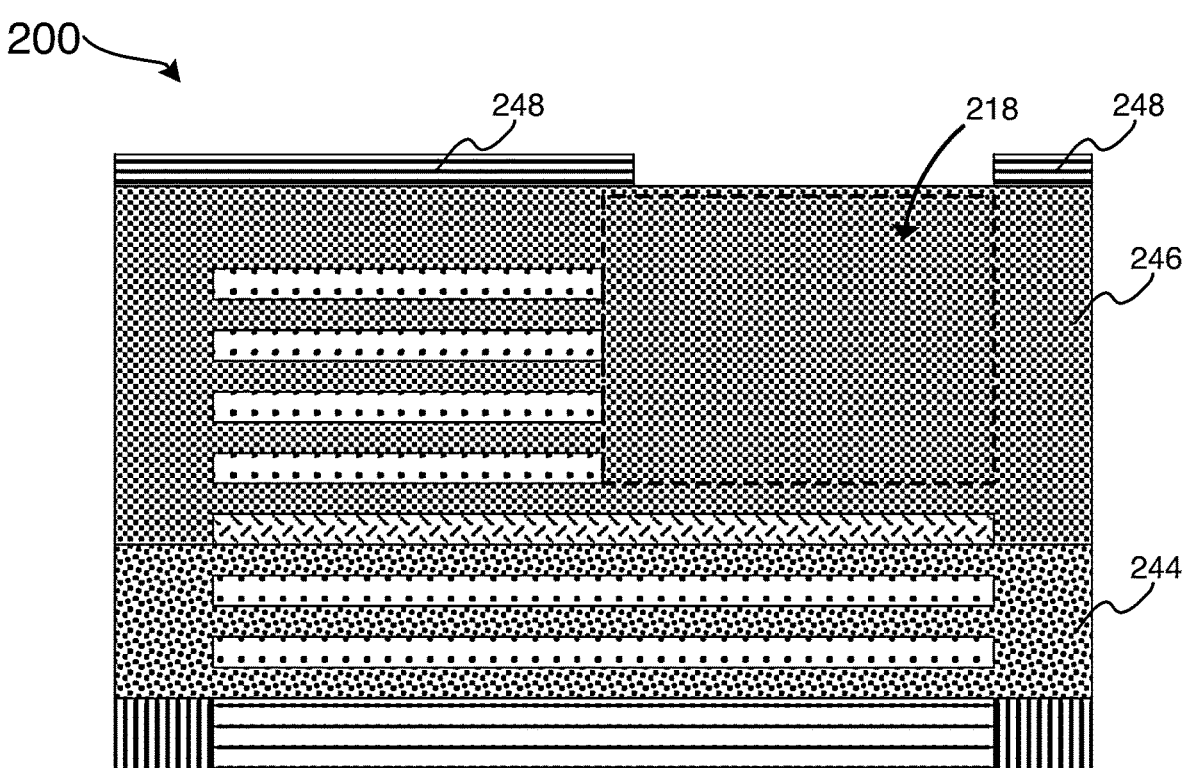
Figure 2X:
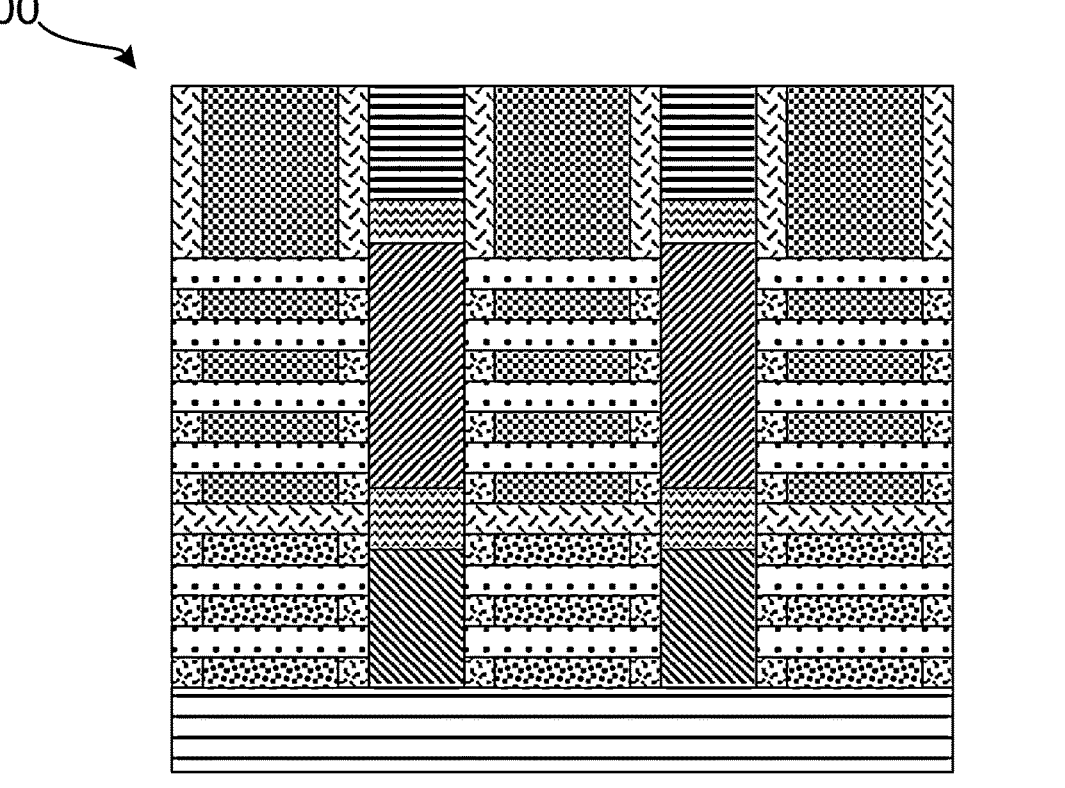

FIGS. 2W and 2X illustrate a twelfth stage in forming semiconductor cell 200. In this stage, hard mask 248 is patterned on the top surface of gate material 246. A gap in hard mask 248 is present above top FET cutout region 218, which is again illustrated with a dashed line.

Figure 2Y:
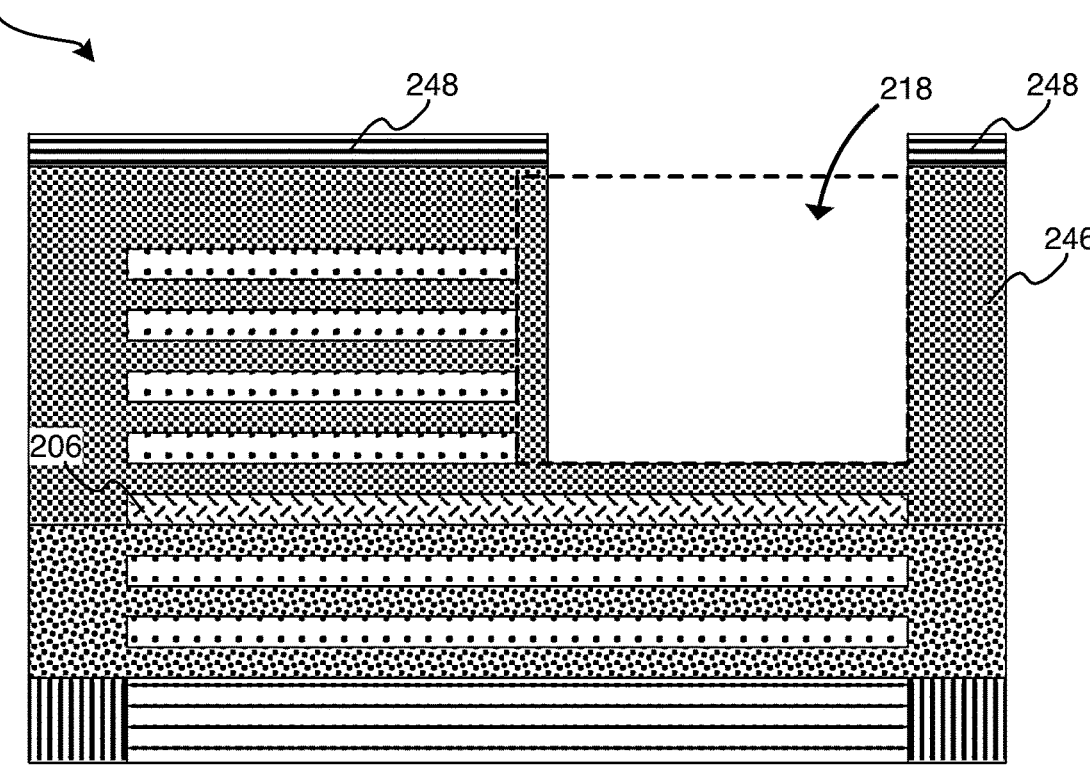
Figure 2Z:
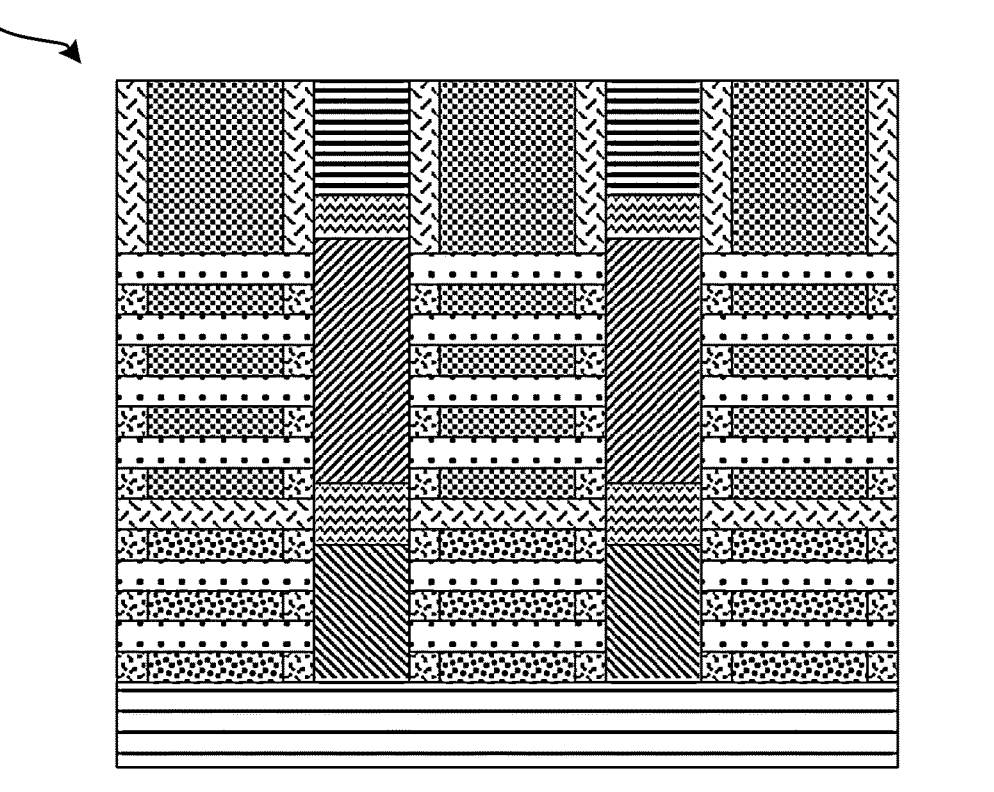
Figure 2A:
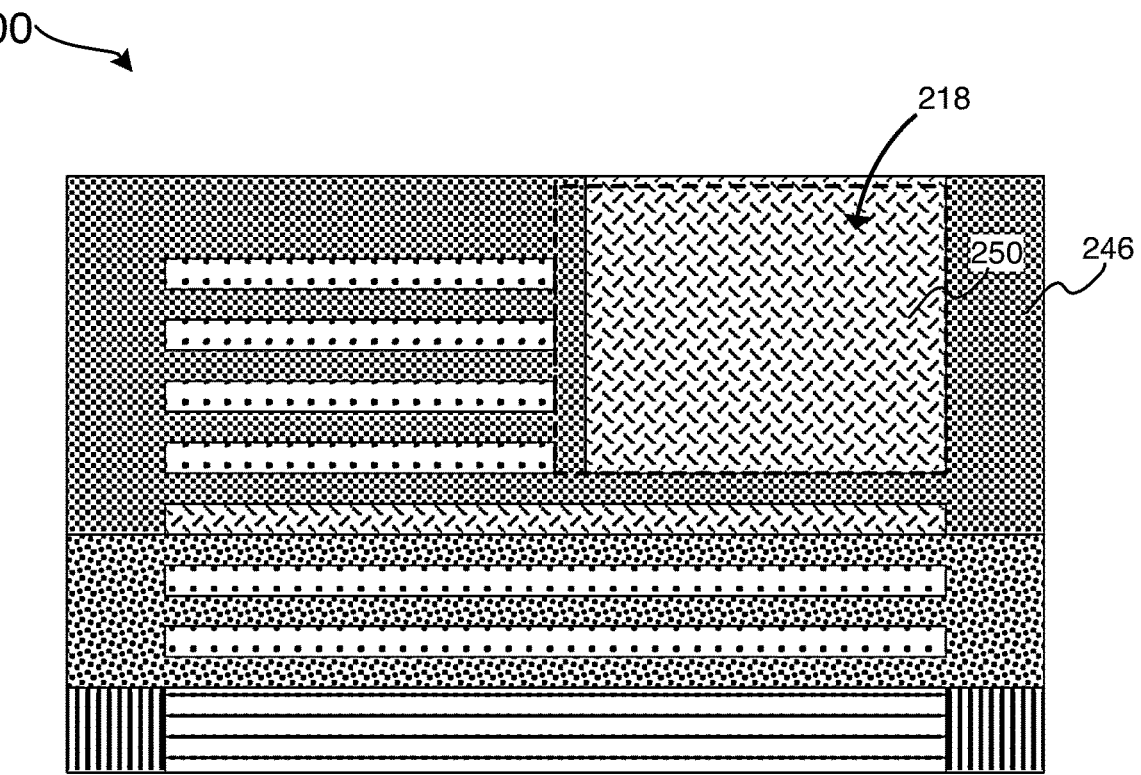
Figure 2B:
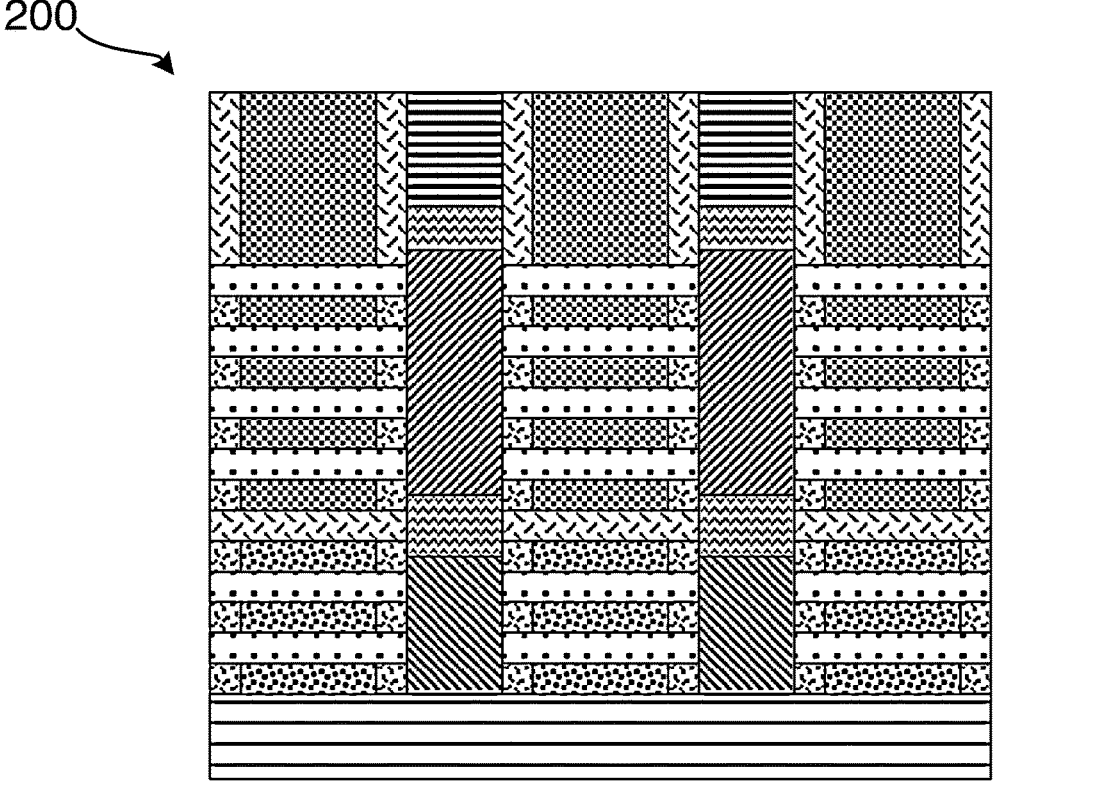
Figure 2C:
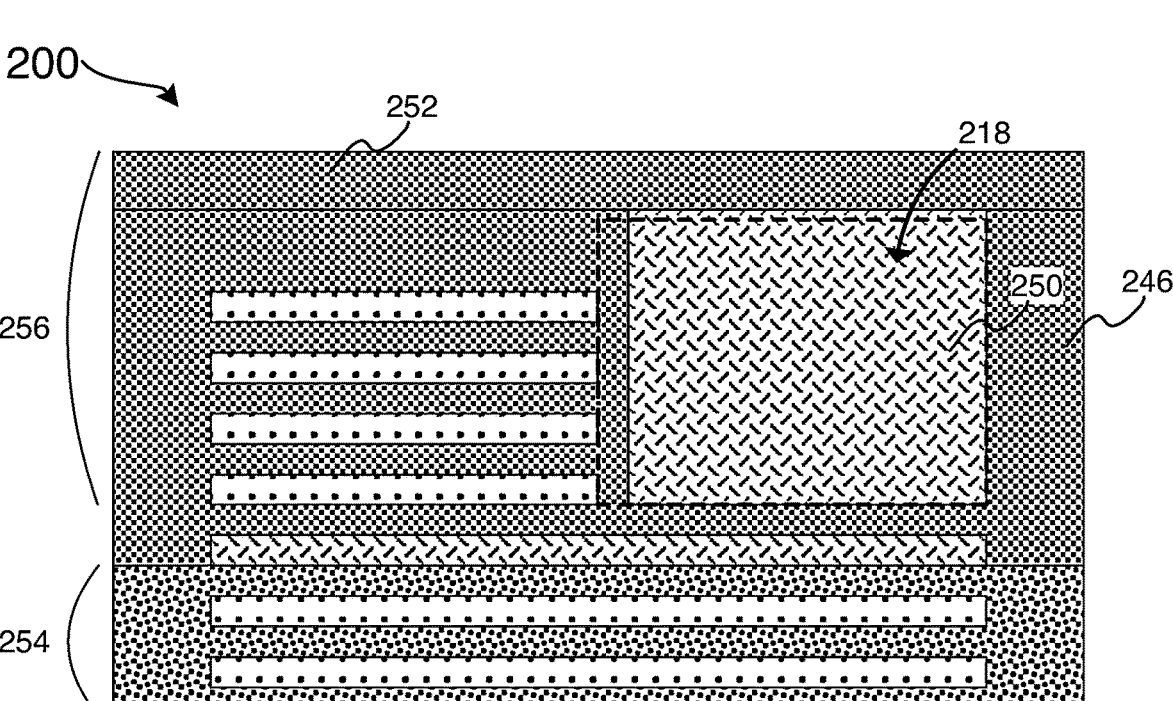
Figure 2D:
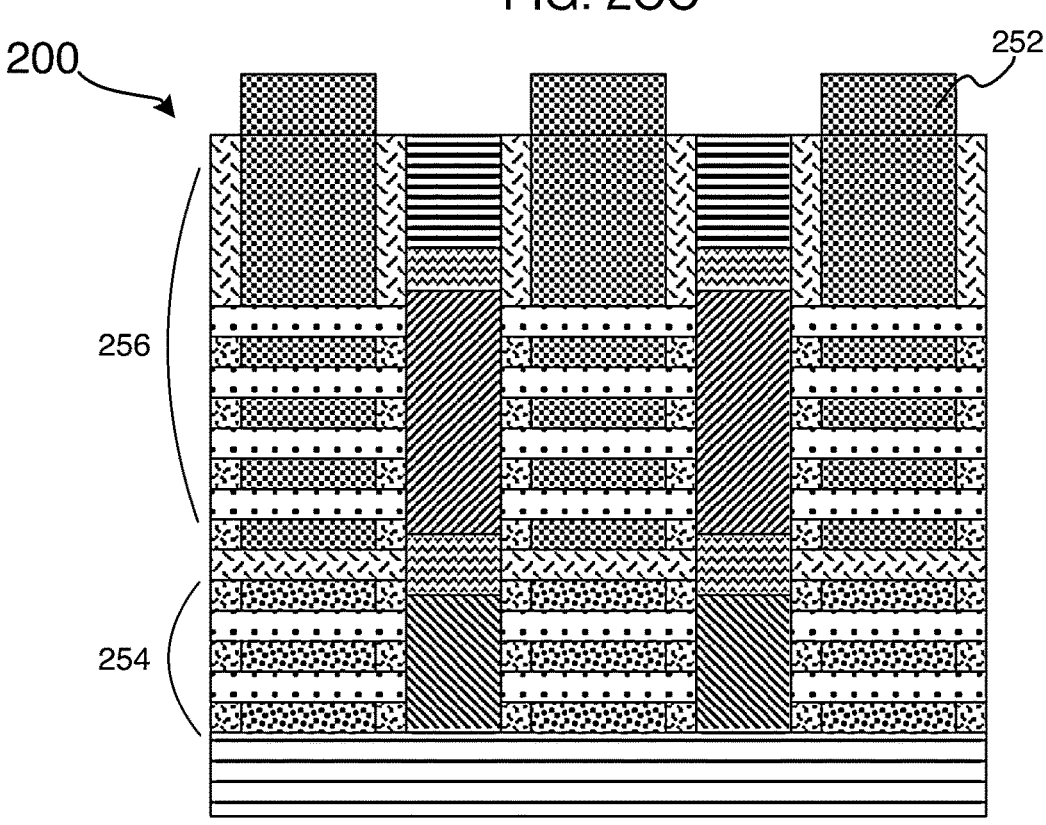

FIGS. 2Y and 2Z illustrate a thirteenth stage in forming semiconductor cell 200. In this stage, gate material 246 has been etched where it is not covered by hardmask 248. This has resulted in a well within top FET cutout region 218. For the purpose of clarity, it is noted that the well formed in this step may be of different dimensions that the top FET cutout region 218 that was originally formed in FIG. 2C during patterning of the top FET. Rather, in semiconductor cell 200, this well has been formed within top FET cutout region 218, but is not defined by its borders.

Forming the well within top FET cutout region 218 may have been performed, for example, with a reactive ion etching process that was timed to stop before hitting MDI layer 206, leaving a small amount of gate material 246 at the bottom surface of the well. In other embodiments, this may have been performed with an etchant that is selective to MDI layer 206, in which case the well in top FET cutout region 218 would have extended all the way to the top surface of MDI layer 206, at which point MDI layer 206 would act as an etch stop. Of note, this well would typically only be formed in the gate regions of semiconductor cell 200. As such, the spaces between gate material 246 in FIG. 2Z would not be etched.

FIGS. 2AA and 2BB illustrate a fourteenth stage in forming semiconductor cell 200. In this stage, hardmask 248 has been removed and the well within top FET cutout region 218 has been filled with dielectric fill 250. Dielectric fill 250 may be a low-K dielectric, such as silicon oxycarbonitride (SiOCN). Dielectric fill 250 may then have been planarized through CMP such that the top surface of dielectric fill 250 is coplanar with the top surface of gate material 246. Filling a large portion of top FET cutout region 218 with dielectric fill may be beneficial because it prevents unwanted parasitic capacitance caused by a large amount of excess gate material within top FET cutout region 218.

FIGS. 2CC and 2DD illustrate a fifteenth stage in forming semiconductor cell 200. In this stage, a gate cap 252 has been formed upon the exposed top surfaces of gate material 246 and dielectric fill 250. This has effectively completed semiconductor cell 200, forming bottom FET 254 and top FET 256. Because gate cap 252 is composed of the same work function metal as gate material 246, it effectively extends gate material 246 such that it surrounds dielectric fill 250. This may be beneficial, for example, to enable a gate contact for top FET 256 to be placed anywhere along gate cap 252, including directly over dielectric fill 250.

Figures 3, 4:
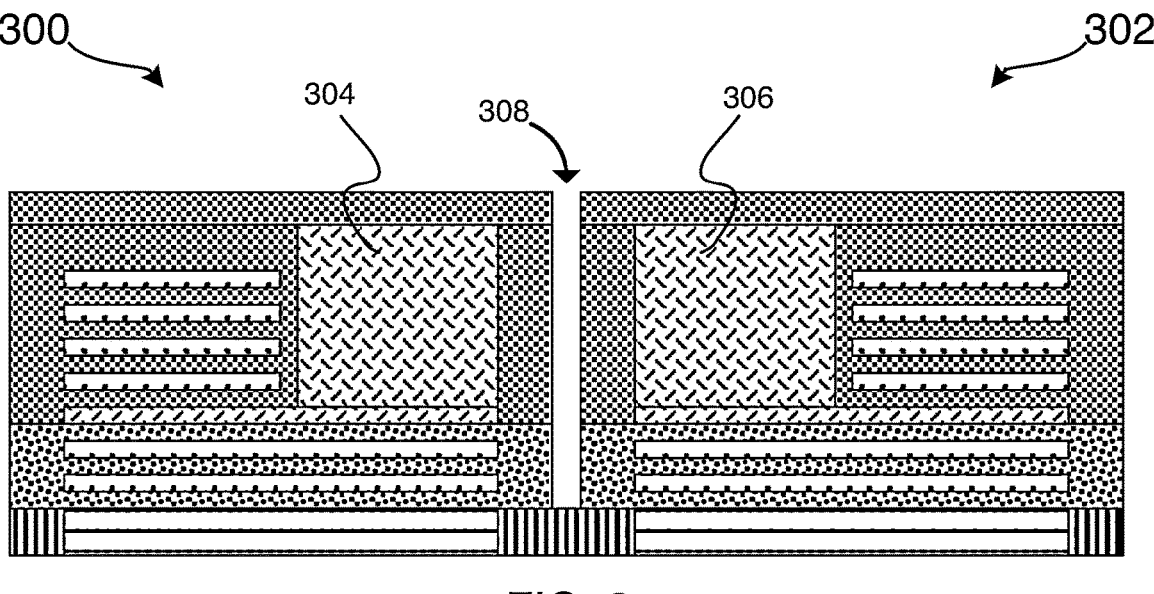
FIG. 3 depicts a set of semiconductor cells in a separated formation in accordance with embodiments of the present disclosure.
FIG. 4 depicts a set of semiconductor cells in a gate pass through formation in accordance with embodiments of the present disclosure.

FIG. 3 depicts a set of semiconductor cells 300 and 302 in a separated formation in accordance with embodiments of the present disclosure. Both cells 300 and 302 depict top and bottom nanosheet FETs in a stacked profile. Cell 300 has been formed with dielectric fill 304 within a top FET cutout region and cell 302 has been formed with dielectric fill 306 within a top FET cutout region. Cells 300 and 302 have been separated by gate cut through 308, which may help prevent capacitance issues between cells 300 and 302. Because cells 300 and 302 are separated by gate cut through region 308, they are referred to herein as being in a "separated formation." This may be beneficial, for example, in use cases in which cells 300 and 302 would otherwise be connected by a common gate, such as through a gate cap (e.g., gate cap 252). Gate cut region would allow isolation of cells 300 and 302.

FIG. 4 depicts a set of semiconductor cells 400 and 402 in a gate pass through formation in accordance with embodiments of the present disclosure. Both cells 400 and 402 depict top and bottom nanosheet FETs in a stacked profile. However, unlike cells 300 and 302, cells 400 and 402 have been formed with one large dielectric fill region 404 shared between them. Dielectric fill region 404 occupies a top FET cutout region in cell 400, a top FET cutout region in cell 402, and the inter-cellular space between cells 400 and 402. This large dielectric fill region 404 may further reduce parasitic capacitance in both cells 400 and 402. Further, this formation may beneficially reduce the number of cuts that are necessary between cells during chip formation, which may increase efficiency and decrease the necessary precision of cuts between cells. This gate pass through formation would also allow cells 400 and 402 to be connected by a common gate (e.g., through a gate cap).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor cell comprising:
a top field effect transistor (FET) that contains a first set of silicon nanosheets and a top-FET gate material;
a bottom FET that contains a second set of silicon nanosheets, wherein the top FET and bottom FET are in a stacked profile;
a top FET cutout region lateral to the first set of nanosheets and above a portion of the second set of nanosheets; and
a dielectric fill within the top FET cutout region, wherein the top-FET gate material extends beneath the dielectric fill and in direct contact with a bottom surface of the dielectric fill.

2. The semiconductor cell of claim 1, further comprising:
a gate cap formed on the top-FET gate material and the dielectric fill.

3. The semiconductor cell of claim 1,
wherein the top-FET gate material is formed between the dielectric fill and the first set of silicon nanosheets and upon a top surface of the dielectric fill.

4. The semiconductor cell of claim 1, further comprising a gate sidewall that is in the top FET cutout region and between the dielectric fill and the first set of silicon nanosheets.

5. The semiconductor cell of claim 1, further comprising a middle dielectric isolation layer between the first set of silicon nanosheets and the second set of silicon nanosheets.

6. The semiconductor cell of claim 1, further comprising:
a middle dielectric isolation layer between the first set of silicon nanosheets and the second set of silicon nanosheets; and
wherein the top gate material is located between the dielectric fill and the middle dielectric isolation layer.

7. The semiconductor cell of claim 1, further comprising a middle dielectric isolation layer between the first set of silicon nanosheets and the second set of silicon nanosheets, wherein the dielectric fill and the middle dielectric isolation layer are composed of a same material.

8. A set of semiconductor cells, the set of semiconductor cells comprising:
a first semiconductor cell with a first top FET cutout region, wherein a first dielectric fill is formed within the first top FET cutout region, wherein the first semiconductor includes a first plurality of nanosheets; and
a second semiconductor cell with a second top FET cutout region, wherein a second dielectric fill is formed within the second top FET cutout region, wherein the second semiconductor includes a second plurality of nanosheets, wherein the first dielectric fill is located a first distance from the second dielectric fill, wherein the first plurality of nanosheets is located a second distance from the second plurality of nanosheets, wherein the first distance is smaller than the second distance.

9. The set of semiconductor cells of claim 8, wherein the first dielectric fill and the second dielectric fill are a same dielectric fill.

10. The set of semiconductor cells of claim 9, further comprising a gate cap formed upon a top surface of the dielectric fill, wherein the gate cap spans a width of the first semiconductor cell and the second semiconductor cell.

11. The set of semiconductor cells of claim 8, further comprising a gate cut through between the first dielectric fill and the second dielectric fill.

12. The set of semiconductor cells of claim 8, further comprising:
a third semiconductor cell located horizontally with respect to the first semiconductor cell from a cross-gate-cut view perspective, wherein the third semiconductor cell comprises a third top FET cutout region, and wherein a third dielectric fill is formed within the third top FET cutout region.

13. A semiconductor cell in a set of semiconductor cells, the semiconductor cell comprising:
a top field effect transistor (FET) that contains a first set of silicon nanosheets and a top-FET gate material;
a bottom FET that contains a second set of silicon nanosheets, wherein the top FET and the bottom FET are in a stacked profile;
a top FET cutout region lateral to the first set of nanosheets and above a portion of the second set of nanosheets; and a dielectric fill within the top FET cutout region, wherein the top-FET gate material extends beneath the dielectric fill and in direct contact with a bottom surface of the dielectric fill.

14. The semiconductor cell of claim 13, further comprising:

a gate cap formed on the top-FET gate material and the dielectric fill.

15. The semiconductor cell of claim 13, wherein the top-FET gate material is formed between the dielectric fill and the first set of silicon nanosheets and upon a top surface of the dielectric fill.

16. The semiconductor cell of claim 13, further comprising a gate sidewall that is in the top FET cutout region and between the dielectric fill and the first set of silicon nanosheets.

17. The semiconductor cell of claim 13, further comprising a middle dielectric isolation layer between the first set of silicon nanosheets and the second set of silicon nanosheets.

18. The semiconductor cell of claim 13, further comprising:

a middle dielectric isolation layer between the first set of silicon nanosheets and the second set of silicon nanosheets; and wherein the top gate material is located between the dielectric fill and the middle dielectric isolation layer.

19. The semiconductor cell of claim 13, further comprising a middle dielectric isolation layer between the first set of silicon nanosheets and the second set of silicon nanosheets, wherein the dielectric fill and the middle dielectric isolation layer are composed of a same material.

* * * * *